(12) United States Patent
Miyazaki

(10) Patent No.: US 9,165,505 B2
(45) Date of Patent: Oct. 20, 2015

(54) DISPLAY DEVICE AND ELECTORIC DEVICE HAVING THE SAME

(75) Inventor: Aya Miyazaki, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 1918 days.

(21) Appl. No.: 11/652,977

(22) Filed: Jan. 10, 2007

(65) Prior Publication Data

US 2007/0164939 A1    Jul. 19, 2007

(30) Foreign Application Priority Data

Jan. 13, 2006 (JP) ................................. 2006-006766

(51) Int. Cl.
*G09G 3/32* (2006.01)
*G09G 3/20* (2006.01)
*G11C 19/00* (2006.01)

(52) U.S. Cl.
CPC ............... *G09G 3/3266* (2013.01); *G09G 3/20* (2013.01); *G11C 19/00* (2013.01); *G09G 3/2022* (2013.01); *G09G 2310/0216* (2013.01); *G09G 2310/0262* (2013.01); *G09G 2310/0267* (2013.01); *G09G 2320/029* (2013.01); *G09G 2320/041* (2013.01); *G09G 2320/043* (2013.01); *G09G 2330/021* (2013.01)

(58) Field of Classification Search
CPC ............. G09G 3/3266; G09G 3/3674–3/3681; G09G 2310/0286
USPC .......................................................... 377/67
See application file for complete search history.

(56) References Cited

U.S. PATENT DOCUMENTS

| 6,583,775 | B1 | 6/2003 | Sekiya et al. |
| 6,724,377 | B2 | 4/2004 | Ouchi et al. |
| 6,885,385 | B2 | 4/2005 | Ouchi et al. |
| 7,319,453 | B2 | 1/2008 | Nojiri et al. |
| 7,663,580 | B2 | 2/2010 | Shin |

(Continued)

FOREIGN PATENT DOCUMENTS

| CN | 1713260 A | 12/2005 |
| EP | 1 061 497 A1 | 12/2000 |

(Continued)

OTHER PUBLICATIONS

Mizukami, M. et al, "36.1: 6-Bit Digital VGA OLED," SID 00 Digest, Society for Information Display, International Symposium Digest of Technical Papers, vol. XXXI, May 16-18, 2000, pp. 912-915.

(Continued)

*Primary Examiner* — Kathy Wang-Hurst
*Assistant Examiner* — David Tung
(74) *Attorney, Agent, or Firm* — Husch Blackwell LLP

(57) ABSTRACT

It is an object of the present invention to provide a display device where power consumption can be suppressed and the number of gray scales can be increased without a scanning line driver circuit on both sides of a pixel portion. In a display device having a scanning line driver circuit, a shift register included in the scanning line driver circuit has 4m-stage (m is a natural number) flip-flop circuits in every m scanning lines, and a signal which selects the scanning line in a first half period of one scanning line selection period and a signal which selects the scanning line in a second half period of the one scanning line selection period are output to the scanning line by another start pulse.

24 Claims, 18 Drawing Sheets

(56) References Cited

U.S. PATENT DOCUMENTS

| | | |
|---|---|---|
| 2003/0209989 A1* | 11/2003 | Anzai et al. ............... 315/169.3 |
| 2005/0156853 A1* | 7/2005 | Osame et al. ................ 345/98 |
| 2005/0205880 A1* | 9/2005 | Anzai et al. ................. 257/83 |
| 2006/0007218 A1 | 1/2006 | Miyake et al. |
| 2006/0076567 A1 | 4/2006 | Miyagawa et al. |
| 2006/0109215 A1 | 5/2006 | Tanada et al. |

FOREIGN PATENT DOCUMENTS

| | | |
|---|---|---|
| EP | 1 610 293 A2 | 12/2005 |
| JP | 2001-60076 | 3/2001 |
| JP | 2001-188504 | 7/2001 |
| JP | 2002-215092 | 7/2001 |
| JP | 2002-297094 | 10/2002 |
| JP | 2005-234029 | 9/2005 |
| JP | 2005-338777 | 12/2005 |
| JP | 2006-11368 | 1/2006 |

OTHER PUBLICATIONS

Office Action re Chinese application No. CN 200710002004.3, dated Feb. 29, 2012 (with English translation).

* cited by examiner

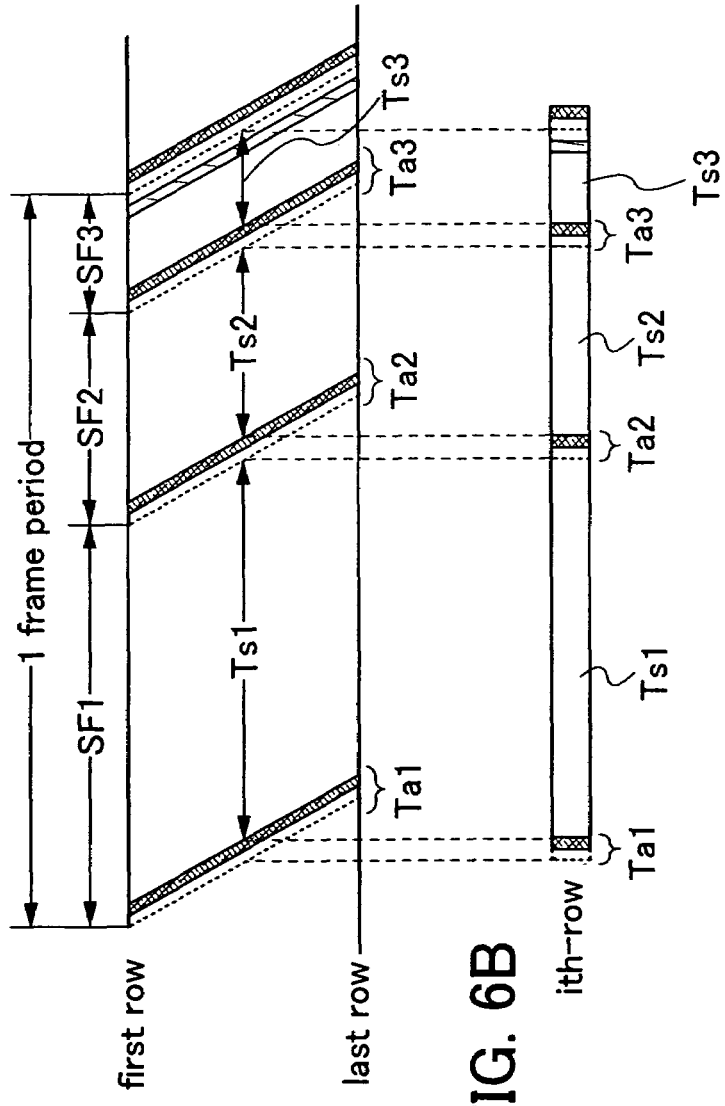

DISPLAY DEVICE AND ELECTORIC DEVICE HAVING THE SAME

BACKGROUND OF THE INVENTION

1. Field of the Invention

The present invention relates to a display device. In particular, the present invention relates to the structure of a scanning line driver circuit in an active matrix display which includes a light-emitting element and which is manufactured by using a semiconductor device.

A semiconductor device herein described indicates any device which can function by using a semiconductor characteristic.

2. Description of the Related Art

In recent years, demand for thin displays mainly applied to TVs, PC monitors, mobile terminals, or the like has increased rapidly, and further development has been promoted. The thin displays include a liquid crystal display device (LCD) and a display device equipped with a light-emitting element. In particular, an active matrix display using a self-light-emitting element is expected as a next-generation display for its features of high response speed, wide viewing angle, and capability of bending with the use of a flexible substrate or the like, in addition to advantages of a conventional LCD such as thinness, lightness in weight, and high image quality.

In an active matrix display using a light-emitting element, a structure shown in FIG. 16B is given as the most basic pixel structure (see Non-Patent Document 1:M. Mizukami, K. Inukai, H. Yamagata, et al., Society for Information Display '00 Digest, vol. 31, pp. 912-915). As a driving method of the pixel structure, there are a current driving method, by which a driving transistor is driven in a saturation region and emission luminance is controlled by current applied to the light-emitting element, and a voltage driving method, by which the driving transistor is driven in a non-saturation region (a linear region) and light emission is controlled by voltage applied to the light-emitting element.

With the above method of current driving, it is necessary to operate the driving transistor in the saturation region. Ideally, current flowing through the light-emitting element does not depend on drain-source voltage (Vds) but on gate-source voltage (Vgs) of the driving transistor. However, when there is variation of characteristics of the driving transistor in each pixel due to a manufacturing process of the transistor or the like, the amount of current flowing through the light-emitting element is affected. In particular, when effective Vgs (hereinafter, referred to as eVgs) is non-uniform depending on pixels due to the variation of threshold voltage (hereinafter, referred to as Vth) of the transistor, emission luminance differs widely among pixels, which results in display unevenness and deterioration of display quality.

Thus, it is desirable to employ a voltage driving method by which a driving transistor is operated in a linear region less subjected to the variation of Vth. As a gray-scale method of the case of driving voltage, a digital time gray-scale method by which a gray scale is displayed with the continuous change of a light-emitting time. In addition, in the digital time gray-scale method, there are problems such as high speed of a signal line driver circuit, increase of a video signal in division number, and increase in number of transistors of each pixel. As a means for solving these problems, a driving method, by which a scanning line selection period is divided back and forth and a writing period and an erasing period of a signal are provided alternately, has been proposed (see Patent Document 1: Japanese Published Patent Application No. 2005-338777).

SUMMARY OF THE INVENTION

The brief description of the driving method which is proposed in Patent Document 1 (hereinafter, referred to as GSD driving) will be explained with reference to FIGS. 16A and 16B.

As shown in FIG. 16A, in the digital time gray-scale method, one frame is divided into sub-frames (SF1 to SF4) corresponding to a bit number and each sub-frame is weighted in accordance with light emission, non-light emission, and a light-emitting time; therefore, luminance is controlled and a gray scale is displayed. Here, an example of a case of 4 bits will be explained. In addition, the number of sub-frames may be a bit number or more, or may be further increased for measures against a pseudo contour.

First, in the SF1, a video signal of a first bit is sequentially written into a first row of a scanning line to a last row thereof, and the row, into which the video signal is written, sequentially moves to a light-emitting period. A light-emitting period shown in FIG. 16A is a light-emitting period of the last row in SF1. In SF2, a video signal of a second bit is sequentially written from rows where the light-emitting period of SF1 is completed, and the rows sequentially move to a light-emitting period in the same manner as SF1.

In addition, a period where a video signal is written into a first row of a scanning line to a last row thereof is referred to as a writing period. In the SF3 and SF4 where the writing period is longer than a light-emitting period, the writing cannot move to a next sub-frame even the light-emitting period is completed; therefore, an erasing period that forcibly makes a non-light-emitting period is inserted. By insert of the erasing period, an accurate gray scale can be displayed.

Specifically, the following explanation will be made along with driving of a pixel shown in FIG. 16B. A selection pulse is input to a scanning line 211, a writing transistor 213 is turned on, and a video signal input to a signal line 210 is written into a driving transistor 214 and a capacitor 215. Here, the explanation will be made for a case where the driving transistor 214 is a p-type transistor. The driving transistor 214 is a p-type transistor. Therefore, in a case where the written video signal is Low (hereinafter, referred to as L), the driving transistor 214 is turned on, current flows through a cathode 217 from a current supply line 212, and a light-emitting element 216 emits light. In addition, in a case where the video signal is High (hereinafter, referred to as H), the driving transistor 214 is turned off; therefore, the light-emitting element 216 is made to emit no light.

In the above erasing period, a scanning line selection period is divided into an erasing timing and a writing timing. In the erasing timing, H potential is always input to the signal line 210, the driving transistor 214 is forcibly turned off in the row which is selected in accordance with the erasing timing, and the light-emitting element 216 is made to emit no light. In addition, in the writing timing, a video signal is input to the signal line 210, and light emission or non-light emission of the light-emitting element 216 is determined by the video signal of each of the row which is selected in accordance with the writing timing.

In the above erasing period, the scanning line selection period is divided back and forth into the erasing timing and the writing timing. This is because, as shown in the period of SF3 of FIG. 16A, the light-emitting period from the first row starts before the writing period up to the last row is completed; therefore, a video signal and an erasing signal have to be input to each of different rows in the same scanning line selection period. In the erasing timing, Hi potential is always input to the signal line 210, the driving transistor 214 is forcibly turned off in the row which is selected in accordance with the erasing timing, and the light-emitting element 216 is made to emit no light. Moreover, in the writing timing, a video signal is input to the signal line 210, and light emission or non-light emission of the light-emitting element 216 is determined by the video signal of each of the row which is selected in accordance with the writing timing.

Further, a division method of the scanning line selection period will be explained with reference to FIG. 17. FIG. 17 shows an example of an active matrix display device. The active matrix display device generally has a signal line driver circuit 312 that outputs video signals to S1 to Sn of a signal line 304, a writing scanning line driver circuit 301 and an erasing scanning line driver circuit 302 that sequentially select G1 to Gm of a scanning line 313, a switching circuit 303 provided between both the scanning line driver circuits and the scanning lines, and a display area 311 where pixels 310 are arranged in a matrix. The pixels 310 each include a writing transistor 305, a driving transistor 306, and a light-emitting element 307.

Line-sequential driving of the signal line driver circuit 312 is performed, and, in the first half and second half of the scanning line selection period which is divided into two periods, a desired video signal and erasing signal are alternately output to the signal line 304. The switching circuit 303 is operated by being synchronized with the first half and second half timings of the scanning line selection period so that writing into the scanning line 313 from each scanning line driver circuit is switched to be in an active or high impedance state. When the video signal from the signal line driver circuit 312 is output to the signal line 304, the output from the writing scanning line driver circuit 301 is in an active state, and the output to the scanning line 313 from the scanning line driver circuit 302 is in a high impedance state. On the other hand, when the erasing signal is output to the signal line 304 from the signal line driver circuit 312, the output from the writing scanning line driver circuit 301 is in a high impedance state, and the output to the scanning line 313 from the scanning line driver circuit 302 is in an active state.

Accordingly, in one scanning line selection period, a video signal and an erasing signal can be written in a different row. However, in order to perform the GSD driving, it is necessary to provide a scanning line driver circuit on both sides. In addition, in the scanning line driver circuits, a pulse width control circuit is necessary besides a switching circuit so that writings into a scanning line from both the scanning line driver circuits do not overlap, and this leads to a disadvantage in narrowing a frame because a circuit area is enlarged. Further, all scanning lines that are connected to the scanning line driver circuit repeat charge and discharge in every scanning line selection period during the erasing timing. Moreover, since the capacitance of the scanning line is high, the power consumption has been increased largely due to the repetition of charge and discharge.

In order to solve the above problems, a new display device and electronic device are provided in the present invention.

According to one feature of the display device of the present invention, in a display device having a scanning line driver circuit for supplying m (m is a natural number) scanning lines with signals, at least 4k-stage (k is a natural number) flip-flop circuits corresponding to each of the scanning lines are provided in a shift register included in the scanning line driver circuit; and a start pulse having different timing is input to the shift register, so that a first selection signal which selects the scanning line in a first period of one scanning line selection period and a second selection signal which selects the scanning line in a second period of the one scanning line selection period are output to the scanning line.

According to another feature of the display device of the present invention, in a display device having a scanning line driver circuit for supplying m (m is a natural number of greater than or equal to 2) scanning lines with signals, among the scanning lines, at least 4k-stage (k is a natural number) flip-flop circuits corresponding to each of the first to (m−1)-th scanning lines are provided, and at least one-stage flip-flop circuit corresponding to the m-th scanning line is provided, in a shift register included in the scanning line driver circuit; and a start pulse having different timing is input to the shift register, so that a first selection signal which selects the scanning line in a first period of one scanning line selection period and a second selection signal which selects the scanning line in a second period of the one scanning line selection period are output to the scanning line.

According to another feature of the display device of the present invention, in a display device having a scanning line driver circuit for supplying m (m is a natural number) scanning lines with signals, at least 4k-stage (k is a natural number) flip-flop circuits corresponding to each of the scanning lines are provided in a shift register included in the scanning line driver circuit; and a start pulse having different timing is input to the shift register, so that a signal for inputting video data to a pixel connected to the scanning line in a first period of one scanning line selection period and a signal for erasing video data input to a pixel connected to the scanning line in a second period of the one scanning line selection period are output to the scanning line.

According to another feature of the display device of the present invention, in a display device having a scanning line driver circuit for supplying m (m is a natural number of greater than or equal to 2) scanning lines with signals, among the scanning lines, at least 4k-stage (k is a natural number) flip-flop circuits corresponding to each of the first to (m−1)-th scanning lines are provided, and at least one-stage flip-flop circuit corresponding to the m-th scanning line is provided, in a shift register included in the scanning line driver circuit; and a start pulse having different timing is input to the shift register, so that a signal for inputting video data to a pixel connected to the scanning line in a first period of one scanning line selection period and a signal for erasing video data input to a pixel connected to the scanning line in a second period of the one scanning line selection period are output to the scanning line.

According to another feature of the display device of the present invention, in a display device having a scanning line driver circuit for supplying m (m is a natural number) scanning lines with signals, at least 4k-stage (k is a natural number) flip-flop circuits corresponding to each of the scanning lines are provided in a shift register included in the scanning line driver circuit; and a start pulse having different timing is input to the shift register, so that a signal for inputting first video data to a pixel connected to the scanning line in a first period of one scanning line selection period and a signal for inputting second video data to a pixel connected to the scanning line in a second period of the one scanning line selection period are output to the scanning line.

According to another feature of the display device of the present invention, in a display device having a scanning line driver circuit for supplying m (m is a natural number of greater than or equal to 2) scanning lines with signals, among the scanning lines, at least 4k-stage (k is a natural number) flip-flop circuits corresponding to each of the first to (m−1)-th scanning lines are provided, and at least one-stage flip-flop circuit corresponding to the m-th scanning line is provided, in a shift register included in the scanning line driver circuit; and a start pulse having different timing is input to the shift register, so that a signal for inputting first video data to a pixel connected to the scanning line in a first period of one scanning line selection period and a signal for inputting second video data to a pixel connected to the scanning line in a second period of the one scanning line selection period are output to the scanning line.

According to another feature of the display device of the present invention, in a display device having a scanning line driver circuit for supplying m (m is a natural number) scanning lines with signals, at least 4k-stage (k is a natural number) flip-flop circuits corresponding to each of the scanning lines are provided in a shift register included in the scanning line driver circuit; a start pulse having different timing is input to the shift register, so that a signal for selecting the scanning line in a first period of one scanning line selection period and a signal for selecting the scanning line in a second period of the one scanning line selection period are output to the scanning line; and the signals output to the scanning line in the first period and the second period are, among the 4k-stage flip-flop circuits corresponding to one of the scanning lines, signals output from any one of the flip-flop circuits.

According to another feature of the display device of the present invention, in a display device having a scanning line driver circuit for supplying m (m is a natural number of greater than or equal to 2) scanning lines with signals, among the scanning lines, at least 4k-stage (k is a natural number) flip-flop circuits corresponding to each of the first to (m−1)-th scanning lines are provided, and at least one-stage flip-flop circuit corresponding to the m-th scanning line is provided, in a shift register included in the scanning line driver circuit; a start pulse having different timing is input to the shift register, so that a signal for selecting the scanning line in a first period of one scanning line selection period and a signal for selecting the scanning line in a second period of the one scanning line selection period are output to the scanning line; and the signals output to the scanning line in the first period and the second period are, among the 4k-stage flip-flop circuits corresponding to one of the scanning lines, signals output from any one of the flip-flop circuits.

According to another feature of the display device of the present invention, in a display device having a scanning line driver circuit for supplying m (m is a natural number) scanning lines with signals, at least 4k-stage (k is a natural number) flip-flop circuits corresponding to each of the scanning lines are provided in a shift register included in the scanning line driver circuit; a start pulse having different timing is input to the shift register, so that a signal for inputting video data to a pixel connected to the scanning line in a first period of one scanning line selection period and a signal for erasing video data input to a pixel connected to the scanning line in a second period of the one scanning line selection period are output to the scanning line; and the signals output to the scanning line in the first period and the second period are, among the 4k-stage flip-flop circuits corresponding to one of the scanning lines, signals output from any one of the flip-flop circuits.

According to another feature of the display device of the present invention, in a display device having a scanning line driver circuit for supplying m (m is a natural number of greater than or equal to 2) scanning lines with signals, among the scanning lines, at least 4k-stage (k is a natural number) flip-flop circuits corresponding to each of the first to (m−1)-th scanning lines are provided, and at least one-stage flip-flop circuit corresponding to the m-th scanning line is provided, in a shift register included in the scanning line driver circuit; a start pulse having different timing is input to the shift register, so that a signal for inputting video data to a pixel connected to the scanning line in a first period of one scanning line selection period and a signal for erasing video data input to a pixel connected to the scanning line in a second period of the one scanning line selection period are output to the scanning line; and the signals output to the scanning line in the first period and the second period are, among the 4k-stage flip-flop circuits corresponding to one of the scanning lines, signals output from any one of the flip-flop circuits.

Note that the display device of the present invention may have a structure where the start pulse that is input from the scanning line driver circuit is input from the side of a flip-flop circuit corresponding to the first scanning line.

Note that the display device of the present invention may have a structure where, on the side (that is, in a preceding stage) of a flip-flop circuit corresponding to the first scanning line, in the scanning line driver circuit, at least one flip-flop circuit is further provided.

Note that the display device of the present invention may have a structure where a plurality of pixels, a signal line driver circuit, and the scanning line driver circuit are included, and the plurality of pixels, the signal line driver circuit, and the scanning line driver circuit are provided on a same substrate.

Note that the display device of the present invention may have a structure where the plurality of pixels are each provided with a light-emitting element, a transistor for driving the light-emitting element, and a transistor for selecting the pixel.

Note that the display device of the present invention includes in its category a liquid crystal display device, a DMD (Digital Micromirror Device), a PDP (Plasma Display Panel), an FED (Field Emission Display), and other display devices that can be displayed by a time gray-scale method, besides a light-emitting device where each pixel is provided with a light-emitting element typified by an organic light-emitting element (OLED).

In addition, in this specification, a light-emitting element includes in its category a light-emitting element of which the luminance is controlled by a current or a voltage. Specifically, the light-emitting element includes an MIM-type electron source element (an electron-emissive element) used for an OLED (Organic Light Emitting Diode), inorganic EL (Electroluminescence), or an FED (Field Emission Display), or the like.

An OLED (Organic Light Emitting Diode) which is one of the light-emitting elements includes a layer (hereinafter, referred to as an electroluminescent layer) containing an electroluminescent material that can obtain luminescence (Electro luminescence) generated by application of an electric field, an anode, and a cathode. The electroluminescent layer is provided between the anode and the cathode and formed in a single layer or a plurality of layers. In some cases, an inorganic compound is included in these layers. The luminescence of the electroluminescent layer includes luminescence (fluorescence) upon returning to a ground state from a singlet-excited state and luminescence (phosphorescence) upon returning to a ground state from a triplet-excited state.

In addition, the display device includes a panel where a light-emitting element is sealed and a module where an IC, which includes a controller, or the like is mounted on the panel.

Note that, as a transistor that can be used for the light-emitting device of the present invention, a thin film transistor using a polycrystalline semiconductor, a microcrystal semiconductor (including a semi-amorphous semiconductor), or an amorphous semiconductor can be used. However, the transistor that can be used for the light-emitting device of the present invention is not limited to a thin film transistor. A transistor that is formed with the use of single-crystalline silicon or a transistor that is formed with the use of SOI may also be used. Moreover, a transistor using an organic semiconductor, a transistor using a carbon nanotube, or a transistor using zinc oxide may also be used. Further, a transistor provided for a pixel of the light-emitting device of the present invention may have a single-gate structure, a double-gate structure, or a multi-gate structure having more than two gates.

In a time division gradation method (also referred to as a time gray-scale method) which is one of the driving methods of a display device, a row writing period is divided into half, the first half of the row writing period (a first row writing period) is used for writing video signals (also referred to as a video signal) into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the present invention, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the present invention, there is no need to provide a switching circuit or the like. Further, with the use of the scanning line driver circuit having the structure of the present invention, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

Moreover, by using the scanning line driver circuit, without limitation to the erasing period, it is possible to select different scanning lines in one scanning line selection period and to input a different video signal to each scanning line. Therefore, light emission of a light-emitting element can be performed in sub-frame periods without provision of an erasing period. Accordingly, display can be performed without decrease of a duty ratio; thus, low power consumption can be realized and a wiring width can also be narrowed.

BRIEF DESCRIPTION OF DRAWINGS

In the accompanying drawings.

FIGS. 6A and 6B are diagrams each showing Embodiment 2 of the present invention.

DETAILED DESCRIPTION OF THE INVENTION

Embodiment modes of the present invention will be explained hereinafter with reference to the accompanying drawings. However, it is to be easily understood that various changes and modifications will be apparent to those skilled in the art. Therefore, unless such changes and modifications depart from the purpose and the scope of the present invention, they should be construed as being included therein.
(Embodiment Mode)

A specific structure of a scanning line driver circuit of the present invention will be explained in detail with reference to FIGS. 1A and 1B. A schematic display device including the scanning line driver circuit of the present invention will be described.

Figure 1A:
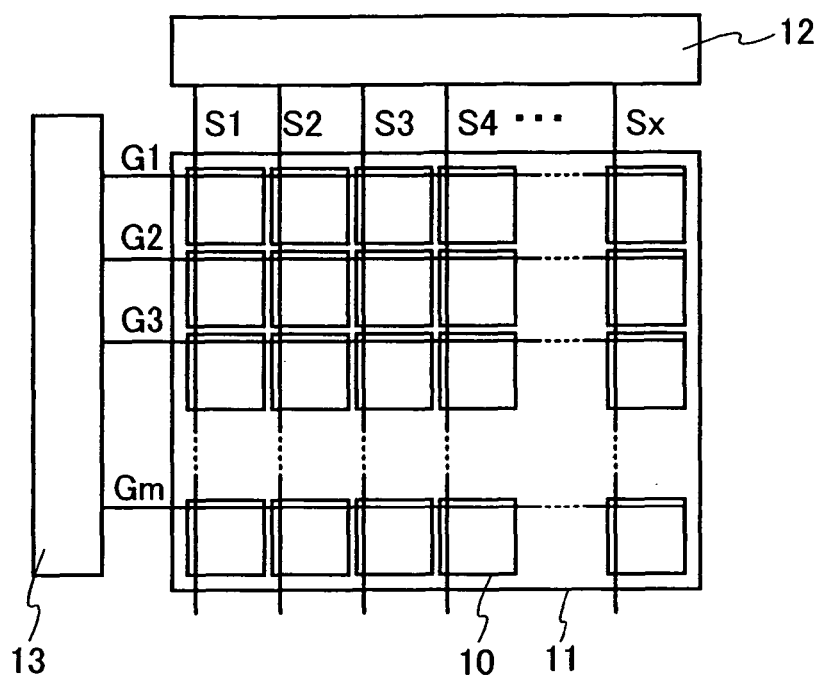
FIGS. 1A and 1B are diagrams each showing a scanning line driver circuit of the present invention.

FIG. 1A shows the structure of the display device including the scanning line driver circuit of the present invention. The display device shown in FIG. 1A includes a pixel portion 11 where a plurality of pixels 10 are formed, a signal line driver circuit 12, and a scanning line driver circuit 13. The pixel 10 of each of scanning lines G1 to Gm, that is, each row can be selected by the scanning line driver circuit 13. The signal line driver circuit 12 can control video signals input to the pixels 10 in a row which is selected by the scanning line driver circuit 13 via each of the signal lines S1 to Sx.

Figure 1B:
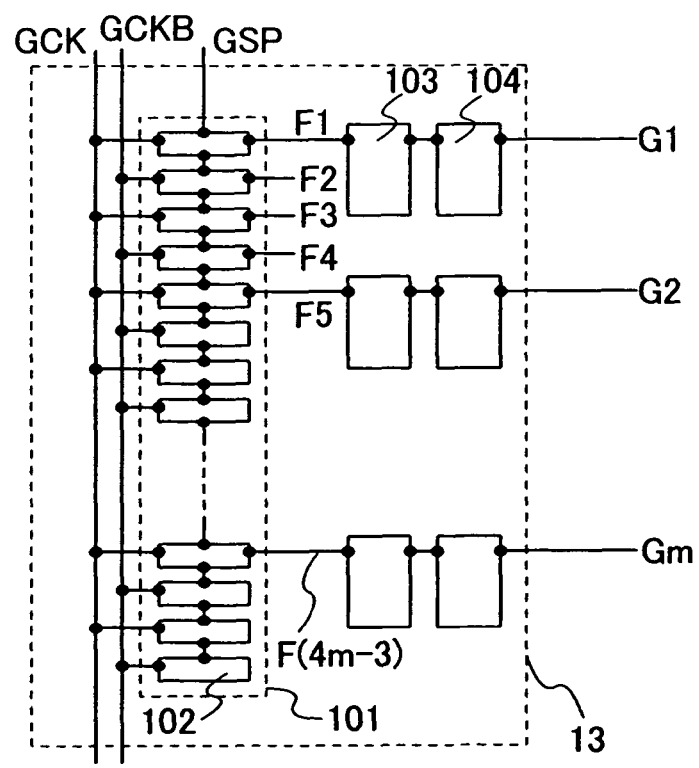

Next, FIG. 1B will explain the structure of the scanning line driver circuit 13 of the present invention shown in FIG. 1A. The scanning line driver circuit 13 includes a shift register 101, a level shifter 103, and a buffer circuit 104, where the shift register 101 is formed of a plurality of flip-flops 102. In addition, a start pulse (GSP) is input to the flip-flop 102 (also referred to as a flip-flop circuit) which is a first stage of the shift register 101, and a clock (GCK) is input to an odd-numbered stage of the flip-flop 102 and inversion of the clock (GCKB) is input to an even-numbered stage thereof. The output of the flip-flop is connected to the level shifter 103 in every four stages, and the input pulse is amplified to an arbitrary voltage. The pulse output from the level shifter 103 is output to the scanning lines G1 to Gm (m is a natural number) via the buffer circuit 104.

Note that it is regarded that the flip-flop 102 in the scanning line driver circuit 13 corresponds to the number of the scanning lines and at least 4k-stages (k is a natural number) of the flip-flops are provided for each scanning line other than the last row. In this embodiment mode, it is regarded that the scanning line driver circuit has 4m-stage flip-flops to make the following explanation.

Figure 18A:
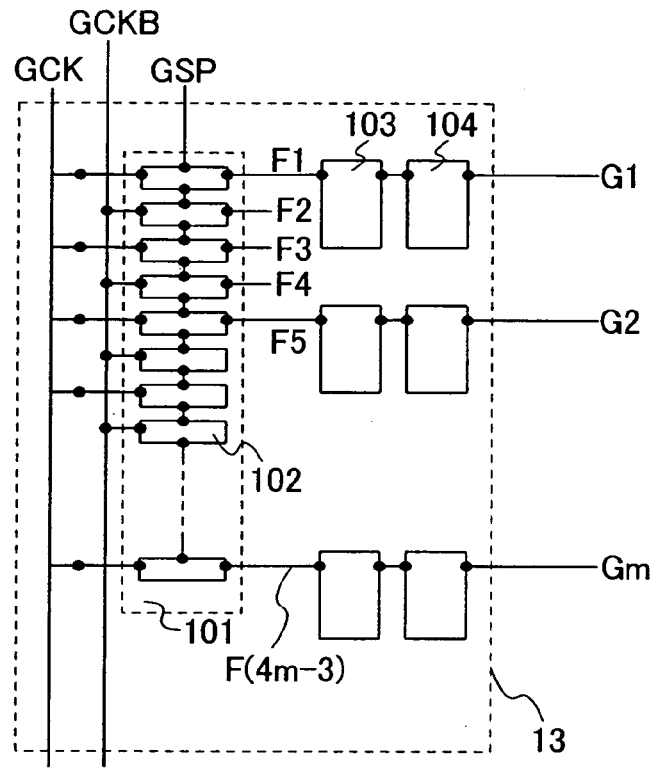
FIGS. 18A and 18B are diagrams each showing a scanning line driver circuit of the present invention.

As shown in FIG. 18A, as for the flip-flops 102 in the scanning line driver circuit 13, at least 4k-stages of the flip-flops are provided for each of the first to (m−1)-th scanning lines. Note that 4k-stages of the flip-flops may be provided for the m-th scanning line as with other scanning lines; however, at least one stage of the flip-flop may be provided. This is because signals output from the flip-flops of (4 (m−1)+1)-th to (4m)-th stages are not used in the flip-flop corresponding to the m-th scanning line. Therefore, by having a structure where the flip-flops of (4 (m−1)+1)-th to (4m)-th stages are not provided in advance, the scanning line driver circuit 13 having a flip-flop circuit can be further miniaturized, which is preferable.

Figure 18B:
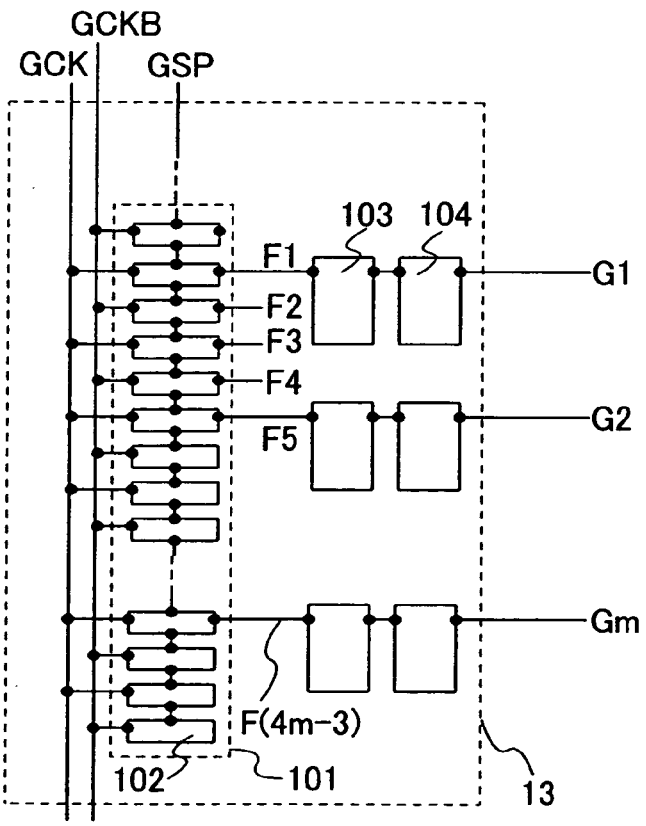

In addition, as shown in FIG. 18B, as for the flip-flops 102 in the scanning line driver circuit 13, a flip-flop may be further provided on the side to which a start pulse is input, in other words, in the preceding stage of the flip-flop that outputs a F1 signal in the flip-flop corresponding to the first scanning line. This is performed to have a more accurate signal input to the flip-flop corresponding to the first scanning line G1. In such a manner, variation of the signals output to the scanning lines G1 to Gm can be reduced, which is preferable.

Figure 2:
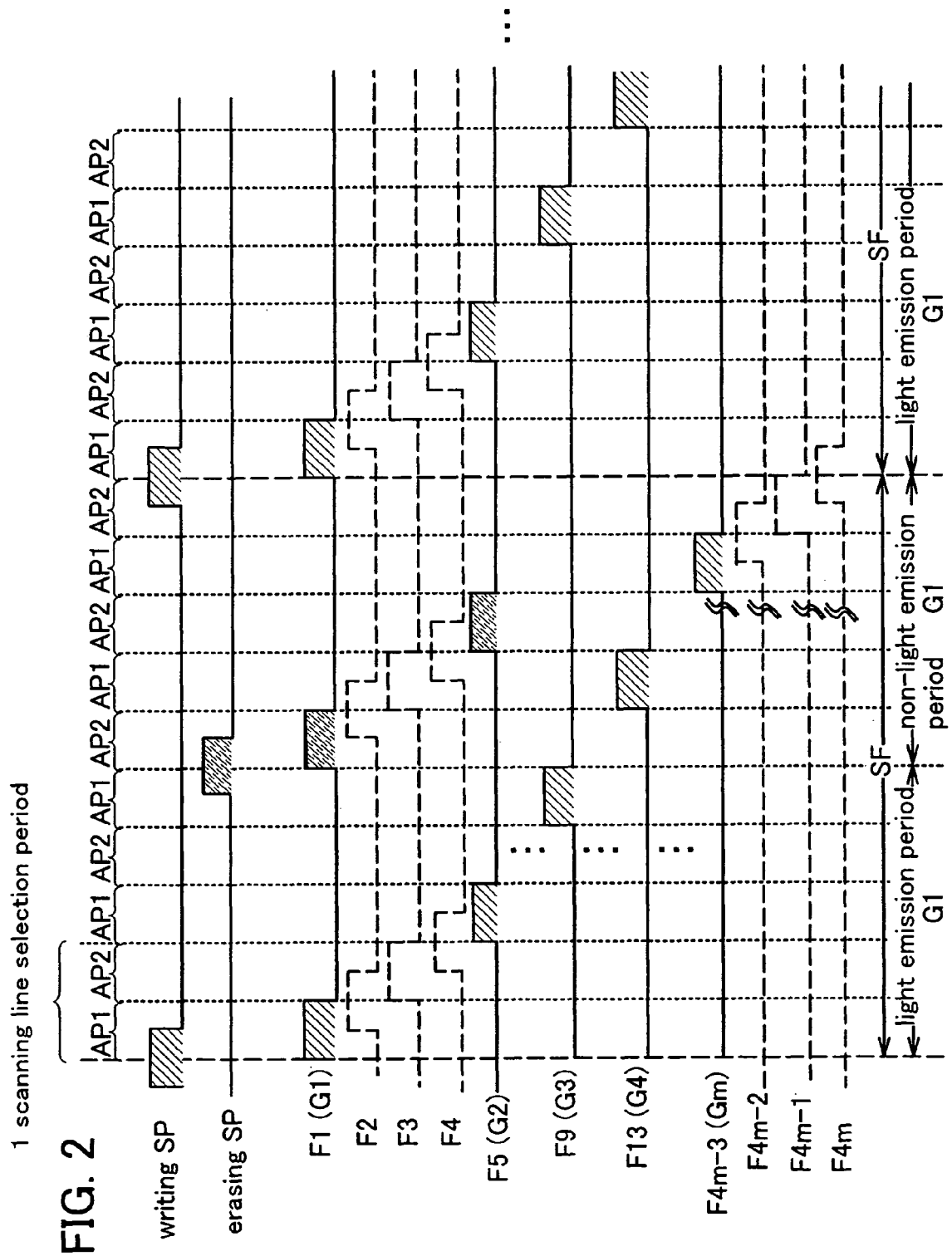
FIG. 2 is a timing chart diagram of a scanning line driver circuit of the present invention.

The driving timing of the scanning line driver circuit 13 will be explained with reference to FIG. 2. FIG. 2 shows a timing chart of the scanning line driver circuit 13.

As shown in FIG. 2, a scanning line selection period is divided into half, a first row writing period AP1 and a second row writing period AP2. When it is necessary to write a video signal into a pixel of a certain row, it is necessary to select a scanning line in the first row writing period AP1 (writing timing). When it is necessary to write an erasing signal into a pixel of a certain row, it is necessary to select a scanning line in the second row writing period AP2 (erase timing).

The input and output of a signal input to the scanning line driver circuit will be explained with reference to FIG. 2.

Note that, in FIG. 2, the timing at which high potential is input is abbreviated to H, and the timing at which low potential is input is abbreviated to L. This is because a semiconductor element included in the flip-flop is turned on (active) with a signal of H. However, without limitation thereto, H and L may be switched as long as on and off of the semiconductor element is controlled by reverse of H and L.

In FIG. 2, first, an H signal of a writing start pulse (writing SP) is input. Then, the writing SP signal is output with the delay by the half cycle of a clock (GCK) via a first stage of the flip-flop 102. In addition, signals sequentially input to a second stage, a third stage, and later stages of the flip-flop are also output with the delay by the half cycle of a clock. Here, for explanation, a signal output from the first stage of the flip-flop is regarded as F1; a signal output from the second stage of the flip-flop, F2; and a signal output from a 4m-th stage of the flip-flop, F4m. Note that, among the output signals, a signal output from a (4 (m−1)+1)-th stage of the flip-flop is output to a scanning line of m-th row. In other words, a signal output from a (4(α−1)+1)-th stage (α is 1 to m) of the flip-flop is output to the scanning lines Gα(G1, G2, G3, . . . , and Gm) of FIGS. 1A and 1B. Note that the signals output to these scanning lines are each referred to as a first selection signal for selecting a scanning line in this specification.

Subsequently, in FIG. 2, an H signal of an erasing start pulse (erasing SP) is input from the first selection signal output to the scanning line G3 at the timing with the delay by the half cycle of a clock. Thus, as with the writing SP, the erasing SP is output as a signal where the output pulse is sequentially shifted by the half cycle of a clock to each stage of the flip-flop. Therefore, in the present invention, without two scanning line driver circuits being provided, video signals of a bit that are input to a pixel can be sequentially erased from the scanning line G1 before all of the scanning lines G1 to Gm are selected in the first row writing period AP1. In such a manner, the video data of a bit that are input to a pixel by the scanning line selected in the first row writing period AP1 can be erased in the second row writing period AP2. Thus, with a focus on the scanning line G1, for example, after G1 is selected in the first row writing period AP1, the scanning line G1 is selected in the second row writing period AP2 before the scanning line Gm is selected in the first row writing period AP1; thus, an erasing signal is input. Then, the video signal written in a pixel when the scanning line G1 is selected in the first row writing period AP1 is held until the scanning line G1 is selected in the second row writing period AP2. Thus, the period after the scanning line G1 is selected in the first row writing period AP1 until the scanning line G1 is selected again in the first row writing period AP1 corresponds to a sub-frame period SF. Note that the erase signal output to the scanning line is referred to as a second selection signal for selecting a scanning line in this specification.

In the first row writing period AP1 and the second row writing period AP2 in FIG. 2, a scanning line to which a selection signal at H level is input among the scanning lines G1 to Gm corresponds to the selected scanning line. Note that FIG. 2 shows the case where the scanning line is selected when the selection signal is at H level; however, the scanning line may also be selected when the selection signal is at L level. To the pixels which share the selected scanning line, corresponding video signals are input from the signal line driver circuit 12 (see FIGS. 1A and 1B).

In a time division gradation method (also referred to as a time gray-scale method) which is one of the driving methods of a display device, a row writing period is divided into half, the first half of the row writing period AP1 (a first row writing period) is used for writing video signals into pixels, and the second half of the row writing period AP2 (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period (a period where a video signal is written into a first row to a last row of a scanning line). With the use of the scanning line driver circuit having the structure of this embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of this embodiment mode, there is no need to provide a switching circuit or the like. Further, with the use of the scanning line driver circuit having the structure of this embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

Note that this embodiment mode can be appropriately combined with other embodiments of this specification.

[Embodiment 1]

This embodiment will explain in detail the structure of a pixel of the display device described in Embodiment Mode.

The structure of the display device will be explained with reference to FIGS. 3A and 3B, FIG. 4, and FIG. 5. A pixel 1010 includes a light-emitting element 1013, a capacitor element 1016, and two transistors. One of the two transistors is a switching transistor 1011 (hereinafter, also referred to as a TFT 1011) for controlling a video signal input to the pixel 1010, and the other is a driving transistor 1012 (hereinafter, also referred to as a TFT 1012) for controlling lighting and non-lighting of the light-emitting element 1013. Each of the TFTs 1011 and 1012 is a field effect transistor, which includes three terminals, a gate electrode, a source electrode, and a drain electrode.

A gate electrode of the TFT 1011 is connected to a gate line Gy, one of a source electrode and a drain electrode thereof is connected to a source line Sx, and the other is connected to a gate electrode of the TFT 1012. One of a source electrode and a drain electrode of the TFT 1012 is connected to a first power source 1017 via a power source line Vx (x is a natural number, 1≤x≤m) and the other is connected to a pixel electrode of the light-emitting element 1013. A counter electrode of the light-emitting element 1013 is connected to a second power source 1018. The capacitor element 1016 is provided between the gate electrode and the source electrode of the TFT 1012. The conductivity type of the TFTs 1011 and 1012 is not particularly limited, and either an n-channel or p-channel transistor may be employed. In the shown configuration, the TFT 1011 is an n-channel transistor while the TFT 1012 is a p-channel transistor. Although either potential of the first power source 1017 or potential of the second power source 1018 is not particularly limited, they are set so that a forward bias is applied to the light-emitting element 1013.

The display device having the above configuration has a feature in that there are two transistors arranged in the pixel 1010. According to such a feature, since the number of the transistors is small, the number of wirings disposed can be inevitably reduced. Thus, a high aperture ratio, high resolution, and high yield can be realized. When the high aperture ratio is realized, current density can be reduced in accordance with increase in a light-emitting area. Thus, a driving voltage can be reduced, which leads to lower power consumption. In addition, reduction in driving voltage leads to higher reliability.

A semiconductor for forming the TFTs 1011 and 1012 may be any of an amorphous semiconductor (for example, amorphous silicon), a microcrystalline semiconductor (for example, a microcrystalline silicon), a polycrystalline semiconductor (for example, polysilicon), an organic semiconductor, and the like. Note that the microcrystalline silicon may be formed by using a silane gas ($SiH_4$) and a fluorine gas ($F_2$) or using a silane gas and a hydrogen gas. Alternatively, the microcrystalline silicon may be obtained by formation of a thin film using the above gas, which is subsequently irradiated with laser light.

Each gate electrode of the TFTs 1011 and 1012 is formed in single or stacked layers by using a conductive material. For example, a stacked layer structure of tungsten (W) and tungsten nitride (WN), a stacked layer structure of molybdenum (Mo), aluminum (Al), and molybdenum (Mo), or a stacked layer structure of molybdenum (Mo) and molybdenum nitride (MoN) may be employed.

A conductive layer (a source wiring and a drain wiring) connected to impurity regions (a source electrode and a drain electrode) included in the TFTs 1011 and 1012 is formed in single or stacked layers by using a conductive material. For example, a stacked layer structure of titanium (Ti), aluminum-silicon (Al—Si), and titanium (Ti), a stacked layer structure of molybdenum (Mo), aluminum-silicon (Al—Si), and molybdenum (Mo), or a stacked layer structure of molybdenum nitride (MoN), aluminum-silicon (Al—Si), and molybdenum nitride (MoN) may be employed.

Figure 3B:
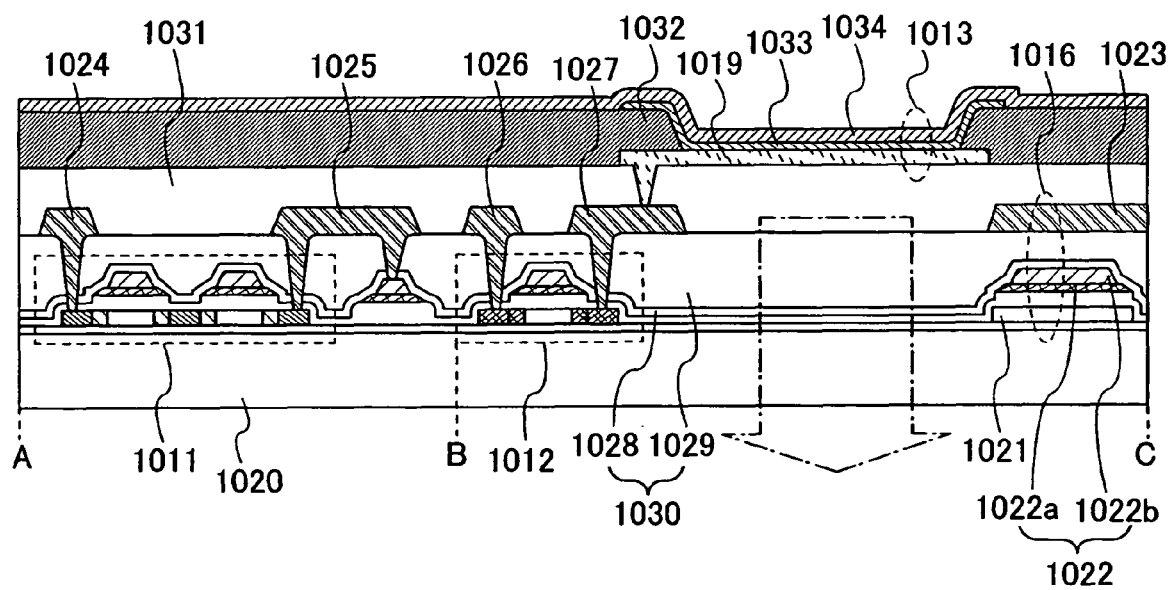
Figure 4:
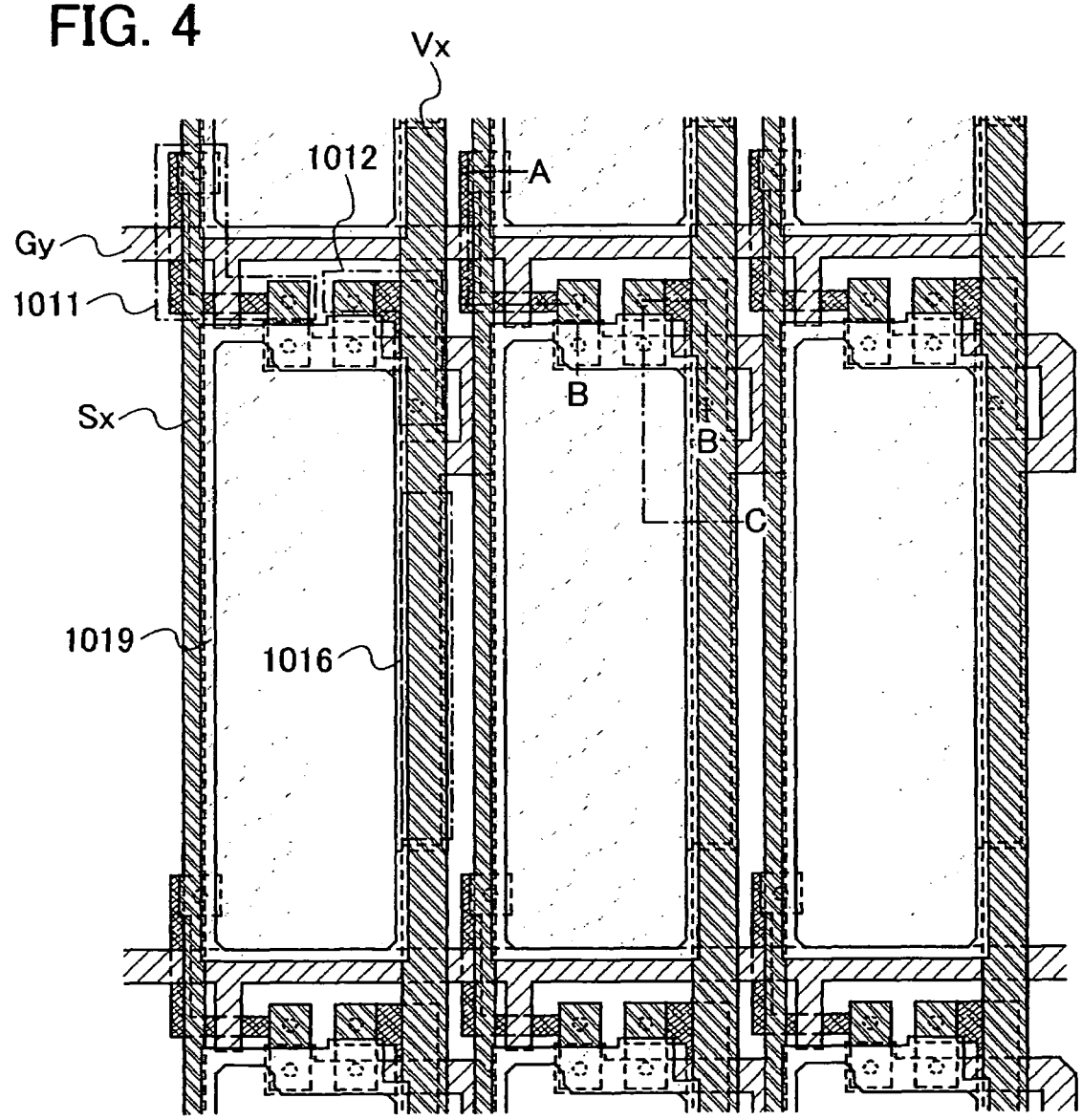
FIG. 4 is a diagram showing Embodiment 1 of the present invention.

FIG. 4 shows a layout of the pixels 1100 having the above configuration. Shown in this layout are the TFTs 1011 and 1012, the capacitor element 1016, and a conductive layer 1019 corresponding to the pixel electrode of the light-emitting element 103. FIG. 3B shows a cross-sectional structure of this layout taken along lines A-B and B-C. The TFTs 1011 and 1012, the light-emitting element 1013, and the capacitor element 1016 are formed over a substrate 1020 having an insulating surface such as glass or quartz.

The light-emitting element 1013 corresponds to stacked layers of the conductive layer 1019 corresponding to the pixel electrode, an electroluminescent layer 1033 and a conductive layer 1034 corresponding to the counter electrode. When both the conductive layers 1019 and 1034 transmit light, the light-emitting element 1013 emits light in both directions of the conductive layer 1019 and the conductive layer 1034. In other words, the light-emitting element 1013 emits light to both sides. On the other hand, when one of the conductive layers 1019 and 1034 transmits light while the other shields light, the light-emitting element 1013 emits light only in the direction of the conductive layer 1019 or the conductive layer 1034. In other words, the light-emitting element 1013 emits light to the top side or the bottom side. FIG. 3B shows a cross-sectional structure in the case where the light-emitting element 13 emits light to the bottom side.

The capacitor element 1016 is disposed between the gate electrode and the source electrode of the TFT 1012 and holds a gate-source voltage of the TFT 1012. The capacitor element 1016 forms a capacitance with a semiconductor layer 1021 provided in the same layer as the semiconductor layers included in the TFTs 1011 and 1012, conductive layers 1022a and 1022b (hereinafter, collectively referred to as a conductive layer 1022) provided in the same layer as the gate electrodes of the TFTs 1011 and 1012, and an insulating layer provided between the semiconductor layer 1021 and the conductive layer 1022. In addition, the capacitor element 1016 forms a capacitance with the conductive layer 1022 provided in the same layer as the gate electrodes of the TFTs 1011 and 1012, a conductive layer 1023 provided in the same layer as conductive layers 1024 to 1027 that are connected to the source electrode or the drain electrode of the TFTs 1011 and 1012, and an insulating layer provided between the conductive layer 1022 and the conductive layer 1023. According to such a structure, the capacitor element 1016 can have a capacitance large enough to hold the gate-source voltage of the TFT 1012. Moreover, the capacitor element 1016 is provided below the conductive layer constituting a power source line Vx; therefore, the layout of the capacitor 1016 does not cause decrease in the aperture ratio.

In addition, a thickness of each of the conductive layers 1023 to 1027 each corresponding to the source or drain wiring of the TFTs 1011 and 1012 is greater than or equal to 500 nm and less than or equal to 2000 nm, or much preferably greater than or equal to 500 nm and less than or equal to 1300 nm. The conductive layers 1023 to 1027 constitute the source line Sx and the power source line Vx. Therefore, by forming the conductive layers 1023 to 1027 thick as set forth in the above structure, an influence of a voltage drop can be suppressed. Note that, when the conductive layers 1023 to 1027 are formed thick, wiring resistance can be made small. However, when the conductive layers 1023 to 1027 are formed too thick, it becomes difficult to perform a patterning process accurately or the surface will be uneven, which is problematic. In other words, the thickness of the conductive layers 1023 to 1027 may be determined within the above range in consideration of wiring resistance, easiness of the patterning process, and an uneven surface.

Moreover, insulating layers 1028 and 1029 (hereinafter, collectively referred to as a first insulating layer 1030) covering the TFTs 1011 and 1012, a second insulating layer 1031 provided over the first insulating layer 1030, and the conductive layer 1019 corresponding to the pixel electrode that is formed over the second insulating layer 1031 are provided. If the second insulating layer 1031 is not formed, the conductive layers 1023 to 1027 each corresponding to the source or drain wiring are formed in the same layer as the conductive layer 1019. Then, the region where the conductive layer 1019 is formed is limited to the region where the conductive layers 1023 to 1027 are not formed. However, the provision of the second insulating layer 1031 increases a margin of the region where the conductive layer 1019 is formed, which realizes a high aperture ratio. Such a structure is quite effective when adopting a top emission structure. When the high aperture ratio is realized, a driving voltage can be lowered in accordance with the increase in light-emitting areas, which leads to reduction in power consumption.

Note that each of the first insulating layer 1030 and the second insulating layer 1031 is formed by using an inorganic material such as silicon oxide or silicon nitride, an organic material such as polyimide or acrylic, or the like. The first insulating layer 1030 and the second insulating layer 1031 may be formed by using either the same materials or different materials. As for the inorganic material, a siloxane-based material may be employed. For example, a material composed of a skeleton structure formed by the bond of silicon and oxygen, which includes at least hydrogen as a substituent, or a material composed of a skeleton structure formed by the bond of silicon and oxygen, which includes at least one of hydrogen, an alkyl group, and aryl group as a substituent is used.

In addition, between the adjacent pixels 1010, a partition layer 1032 (also referred to as a bank, an embankment, or an insulating layer) is provided. A width 1035 of the partition layer 1032 over the capacitor element 1016 may be the width so as to cover the wirings provided on the bottom portion. Specifically, the width 1035 is greater than or equal to 7.5 µm and less than or equal to 27.5 µm, or much preferably greater than or equal to 10 µm and less than or equal to 25 µm (see FIG. 5). In such a manner, by the partition layer 1032 being formed narrow, a high aperture ratio can be realized. When the high aperture ratio is realized, a driving voltage can be lowered in accordance with the increase in light-emitting areas, which leads to reduction in power consumption.

Figure 5:
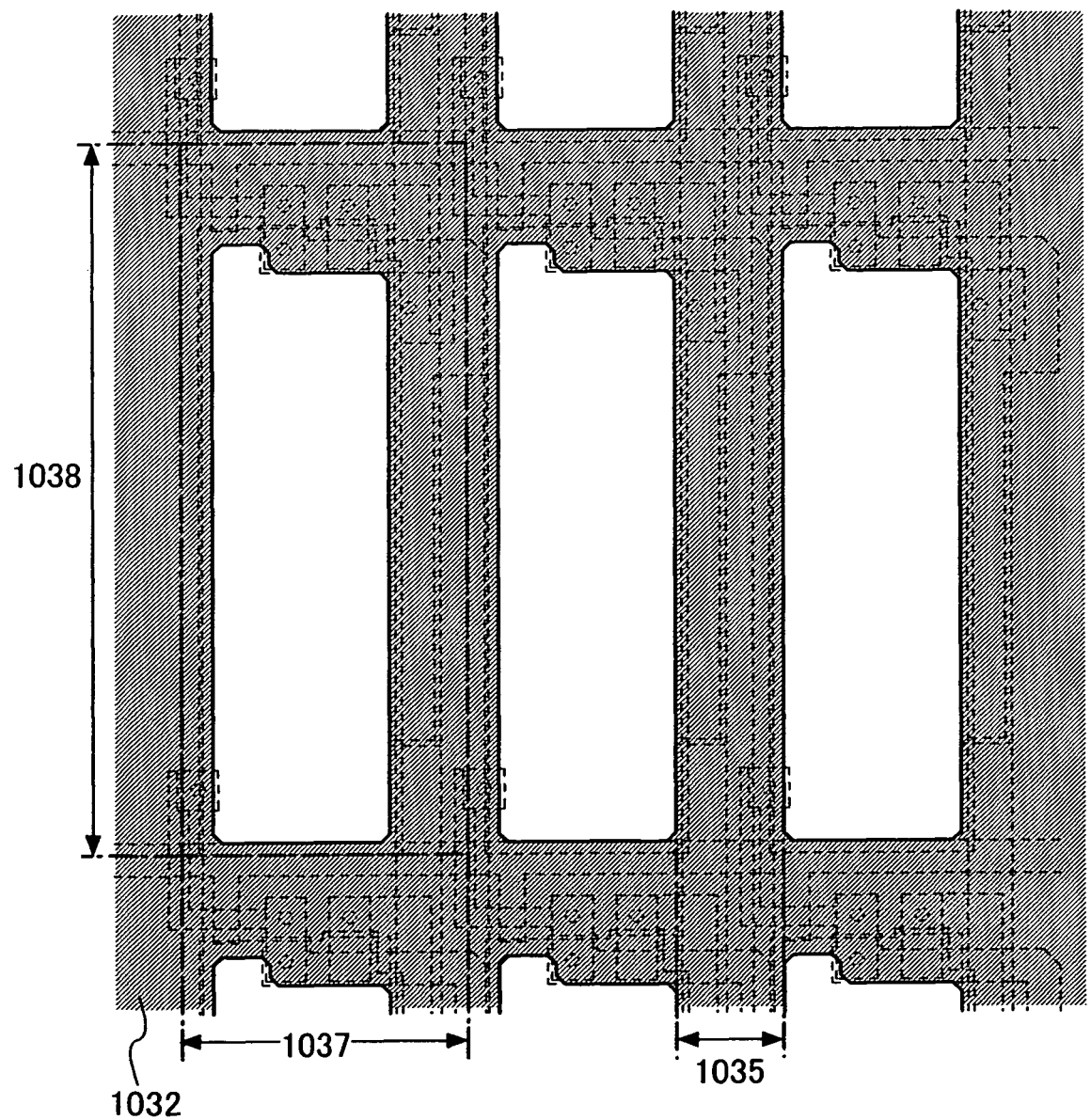
FIG. 5 is a diagram showing Embodiment 1 of the present invention.

Note that, in a layout shown in FIG. 5, an aperture ratio of the pixel is approximately 50%. In FIG. 5, the length of the pixel 1010 in the column direction (longitudinal direction) is shown by a width 1038, while the length of the pixel 1010 in the row direction (lateral direction) is shown by a width 1037. The partition layer 1032 may be formed by using either an inorganic material or an organic material. However, as the electroluminescent layer 1033 is provided so as to be in contact with the partition layer 1032, the partition layer 1032 may be formed to have a continuously variable curvature radius so as not to produce pin holes or the like in the electroluminescent layer 1033 (see FIG. 3B).

Moreover, the partition layer 1032 may shield light. By having a shielding property, contours of the adjacent pixels 1010 become clearer; therefore, a high-resolution image can be displayed. Since the partition layer 1032 contains pigment or a carbon nanotube and is colored with an additive such as pigment or a carbon nanotube, the partition layer 1032 can shield light.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for supplying signals to each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 2]

This embodiment will explain the operation of a display device having the pixels described in Embodiment 1 with reference to a timing chart (FIG. 6A) whose vertical axis denotes a scanning line while horizontal axis denotes time, and a timing chart (FIG. 6B) of a gate line Gi ($1 \leq i \leq m$) in an i-th row. In a time gray-scale method, one frame period includes a plurality of sub-frame periods SF1, SF2, . . . , and SFn (n is a natural number).

Each of the plurality of sub-frame periods includes one of a plurality of writing periods Ta1, Ta2, . . . , and Tan in which the writing operation or the erasing operation is performed, and one of a plurality of light emitting elements Ts1, Ts2, . . . , and Tsn. Each of the plurality of writing periods includes a plurality of gate selection periods. Each of the plurality of gate selection periods includes a plurality of sub-gate selection periods. The number into which each gate selection period is divided is not particularly limited; however, it is preferably 2 to 8, or much preferably 2 to 4. The length of the lighting periods Ts1:Ts2: . . . :Tsn is set to satisfy, for example, $2^{(n-1)}:2^{(n-2)}: \ldots :2^1:2^0$. In other words, the lighting periods Ts1, Ts2 . . . , and Tsn are set to have different length for each bit.

Explanation will be made below on the timing chart for displaying 3-bit gray scales (8 gray scales) (see FIGS. 6A and 6B). In this case, one frame period is divided into three sub-frame periods SF1 to SF3. Each of the sub-frame periods SF1 to SF3 includes one of the writing periods Ta1 to Ta3, and one of the lighting periods Ts1 to Ts3. Each writing period includes a plurality of gate selection periods. Each of the plurality of gate selection periods includes a plurality of sub-gate selection periods. Here, each of the plurality of gate selection periods includes two sub-gate selection periods, and the following cases will be described: a case of the first sub-gate selection period for performing the erasing operation and a case of the second sub-gate selection period for performing the writing operation.

Note that the erasing operation is an operation for bringing the light-emitting element to emit no light, and it is performed only when the erasing operation is necessary in any sub-frame periods.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for supplying signals to each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 3]

This embodiment will explain the operation different from that of the display device described in Embodiment 2.

Figure 7A:
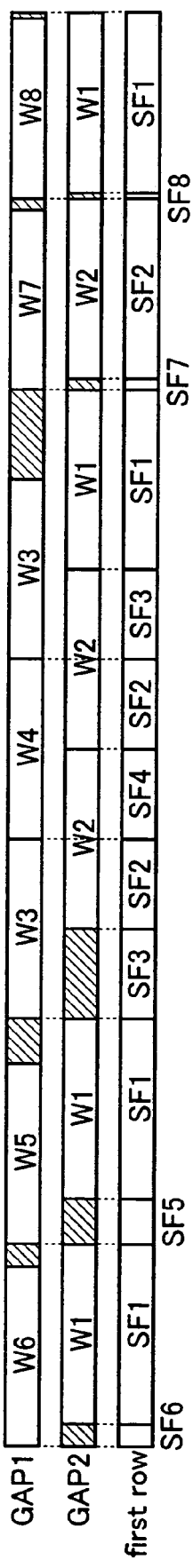
FIGS. 7A and 7B are diagrams each showing Embodiment 3 of the present invention.

The timing of each sub-frame period in this embodiment will be explained. FIG. 7A shows the timing of writing periods indicated by GAP1 at which video signals are written by a scanning line driver circuit in the first half period AP1 of one scanning line selection period which is explained in the above embodiment mode. In addition, the timing of writing periods indicated by GAP2 at which video signals are written by the scanning line driver circuit in the second half period AP2 of one scanning line selection period which is explained in the above embodiment mode is shown. Further, besides, the timing of each sub-frame period which appears in the pixels in the first row is shown. Note that FIG. 7A shows an example, where 8-bit video signals are used in a QVGA panel (320× 240 pixels), for the explanation.

W1 to W8 each indicates the writing period corresponding to a video signal having each bit. Each of the writing periods W1 to W8 has a length obtained by multiplying the half cycle of a clock signal supplied to the scanning line driver circuit by 320.

In FIG. 7A, the period after the writing period W6 is started at the timing GAP1 of the scanning line driver circuit until the writing period W1 is started at the timing GAP2 of the scanning line driver circuit corresponds to a sub-frame period SF6. In addition, the period after the writing period W1 is started at the timing GAP2 of the scanning line driver circuit until the writing period W5 is started by the scanning line driver circuit corresponds to a sub-frame period SF1. Hereinafter, in the same manner, the timing of each sub-frame period is controlled at the timings GAP1 and GAP2 of the scanning line driver circuit.

Figure 7B:
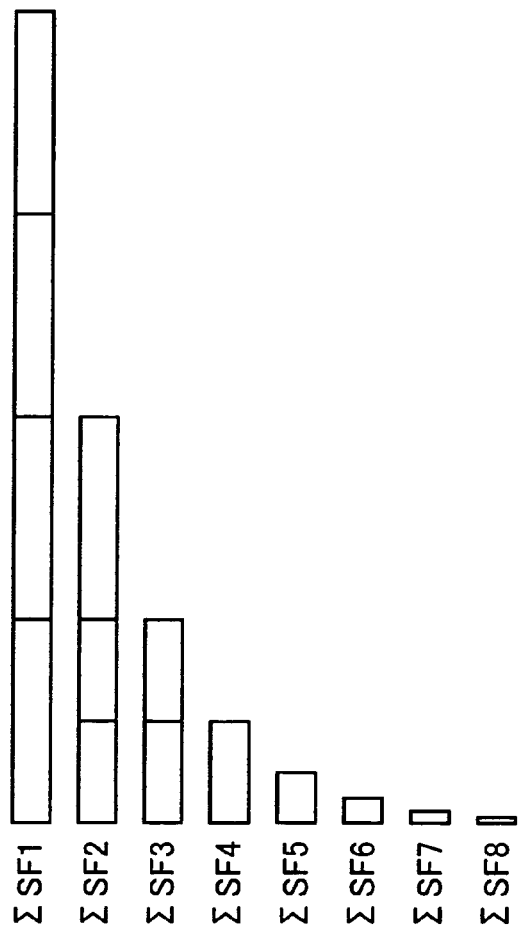

FIG. 7B shows a total length of each sub-frame period. As shown in FIG. 7B, $\Sigma SF1:\Sigma SF2:\Sigma SF3:\Sigma SF4:\Sigma SF5:\Sigma SF6:\Sigma SF7:\Sigma SF8 = 2^7:2^6:2^5:2^4:2^3:2^2:2^1:2^0$. In such a manner, by controlling of the total length of the sub-frame period SFn which is the n-th shortest to be $2^{n-1}$ times as long as the shortest sub-frame period, $2^8$ gray scales can be displayed.

Figure 8:
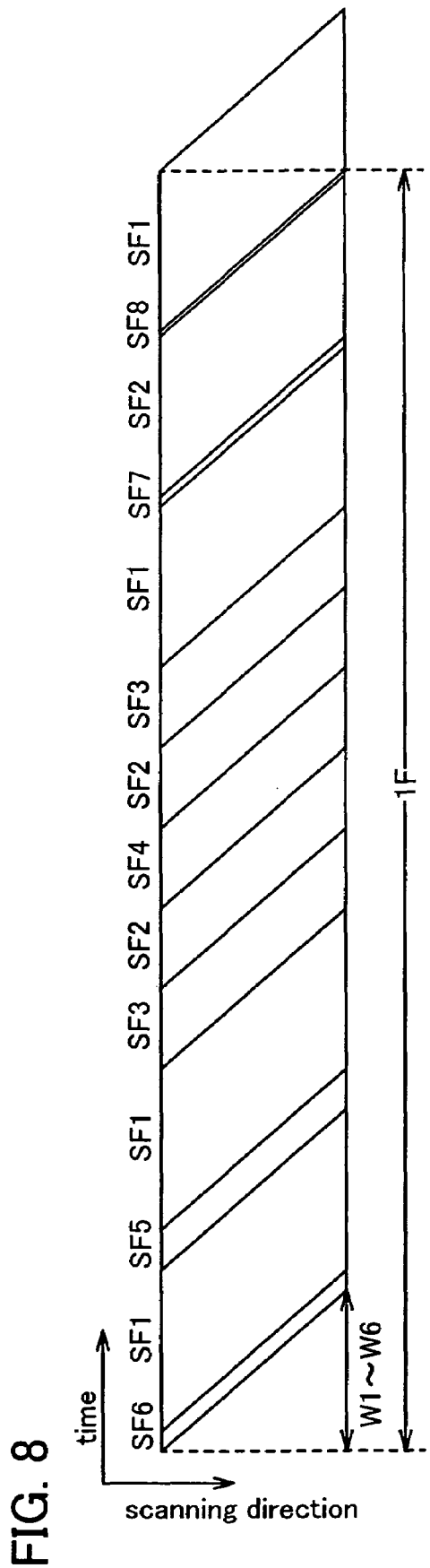
FIG. 8 is a diagram showing Embodiment 3 of the present invention.

FIG. 8 shows a timing chart of the sub-frame periods SF1 to SF8 in the whole pixel portion in the case where the driving method shown in FIG. 7A is adopted. In FIG. 8, a horizontal axis indicates time while a vertical axis indicates the direction in which scanning lines are selected (a scanning direction). In each of the sub-frame periods SF1 to SF8, the period after the first row is selected until the last row is selected corresponds to the writing periods W1 to W6 of each bit. In each row, the period until the completion of the whole sub-frame periods SF1 to SF8 corresponds to one frame period 1F.

Note that, in the driving method shown in FIG. 7A and FIG. 8, the whole sub-frame periods appear continuously, resulting in the duty ratio of 100%. However, the present invention is not limited to such a driving method, and a non-display period may be provided between the sub-frame periods. In order to provide a non-display period, a signal for forcibly stopping current supply to a light-emitting element may be written to each pixel.

In this embodiment, with the use of the scanning line driver circuit of the present invention, different scanning lines can be selected and video signals which are each different can be input not only in an erasing period but also in one scanning line selection period. Therefore, since light emission of a light-emitting element can be performed in the sub-frame periods without provision of an erasing period, display can be performed without decrease of the duty ratio. In addition, since the amount of current can be made small, a wiring width of a power supply line can also be narrowed. Further, it is possible to realize low power consumption.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for supplying signals to each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 4]

Figure 3A:
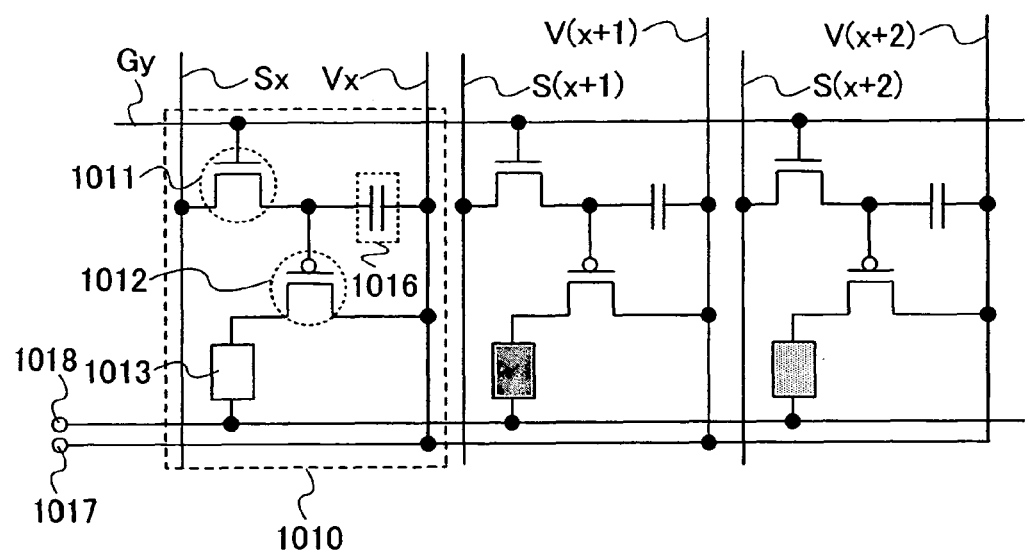
FIGS. 3A and 3B are a diagram and a view each showing Embodiment 1 of the present invention.
Figure 9A:
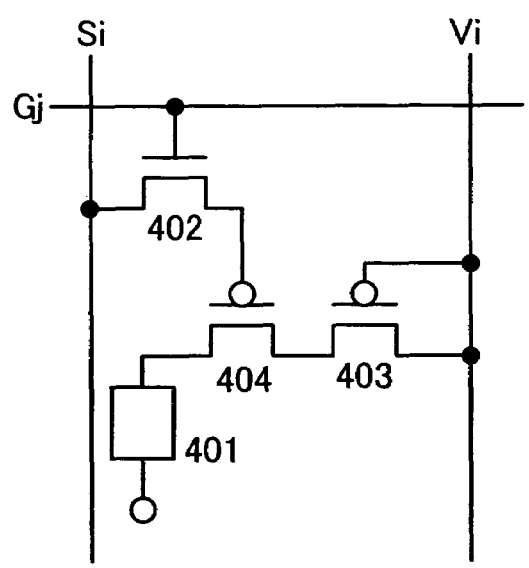
FIGS. 9A and 9B are diagrams each showing Embodiment 4 of the present invention.

A pixel included in the light-emitting device of the present invention is not limited to the configuration shown in FIG. 3A. FIG. 9A shows one mode of a pixel included in the light-emitting device of the present invention. The pixel shown in FIG. 9A includes a light-emitting element 401, a switching transistor 402, a driving transistor 403, and a current control transistor for selecting whether or not to supply current to the light-emitting element 401. Further, although not shown, a capacitor element for holding voltage of a video signal may be formed in the pixel.

The driving transistor 403 and the current control transistor 404 may have the same conductivity or different conductivity. The driving transistor 403 is operated in the saturation region, while the current control transistor 404 is operated in the linear region. Note that the driving transistor 403 is desirably operated in the saturation region; however, the present invention is not limited thereto, and the driving transistor 403 may be operated in the linear region. In addition, the switching transistor 402 is operated in the linear region. The switching transistor 402 may be either an n-channel transistor or a p-channel transistor.

As shown in FIG. 9A, when the driving transistor 403 is a p-channel transistor, it is preferable that an anode of the light-emitting element 401 be a first electrode while a cathode thereof be a second electrode. Note that the first electrode of the light-emitting element corresponds to a pixel electrode and the second electrode thereof corresponds to a counter electrode in this specification. On the other hand, when the driving transistor 403 is an n-channel transistor, it is preferable that the cathode of the light-emitting element 401 be the first electrode while the anode thereof be the second electrode.

A gate of the switching transistor 402 is connected to a scanning line Gj (j=1 to y). One of a source and a drain of the switching transistor 402 is connected to a signal line Si (i=1 to x) while the other is connected to a gate of the current control transistor 404. A gate of the driving transistor 403 is connected to a power supply line Vi (i=1 to x). The driving transistor 403 and the current control transistor 404 are connected to the power supply line Vi and the light-emitting element 401 so that current supplied from the power supply line Vi is supplied to the light-emitting element 401 as the drain current of the driving transistor 403 and the current control transistor 404. In this embodiment, a source of the driving transistor 403 is connected to the power supply line Vi, and the current control transistor 404 is provided between the driving transistor 403 and the first electrode of the light-emitting element 401.

When forming a capacitor element, one of two electrodes of the capacitor element is connected to the power supply line Vi while the other is connected to the gate of the current control transistor 404. The capacitor element is provided for holding the gate voltage of the current control transistor 404.

Figure 9B:
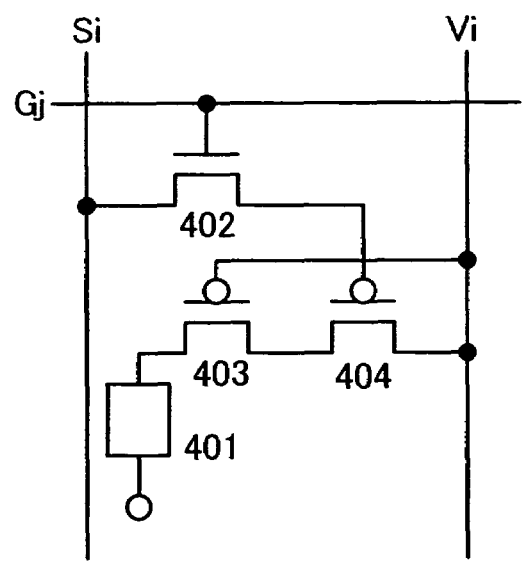

Note that the configuration of the pixel shown in FIG. 9A is only one mode of the present invention; therefore, the light-emitting device of the present invention is not limited to FIG. 9A. For example, as shown in FIG. 9B, a drain of the driving transistor 403 is connected to the first electrode of the light-emitting element 401, and the current control transistor 404 may be provided between the driving transistor 403 and the power supply line Vi. Note that the same portions between FIGS. 9A and 9B are denoted by the same reference numerals.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 5]

Figure 10A:
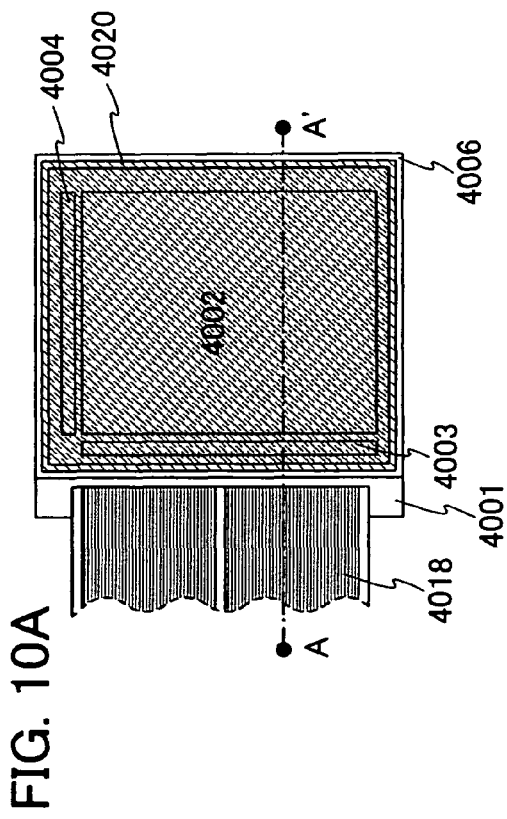
FIGS. 10A and 10B are views each showing Embodiment 5 of the present invention.
Figure 10B:
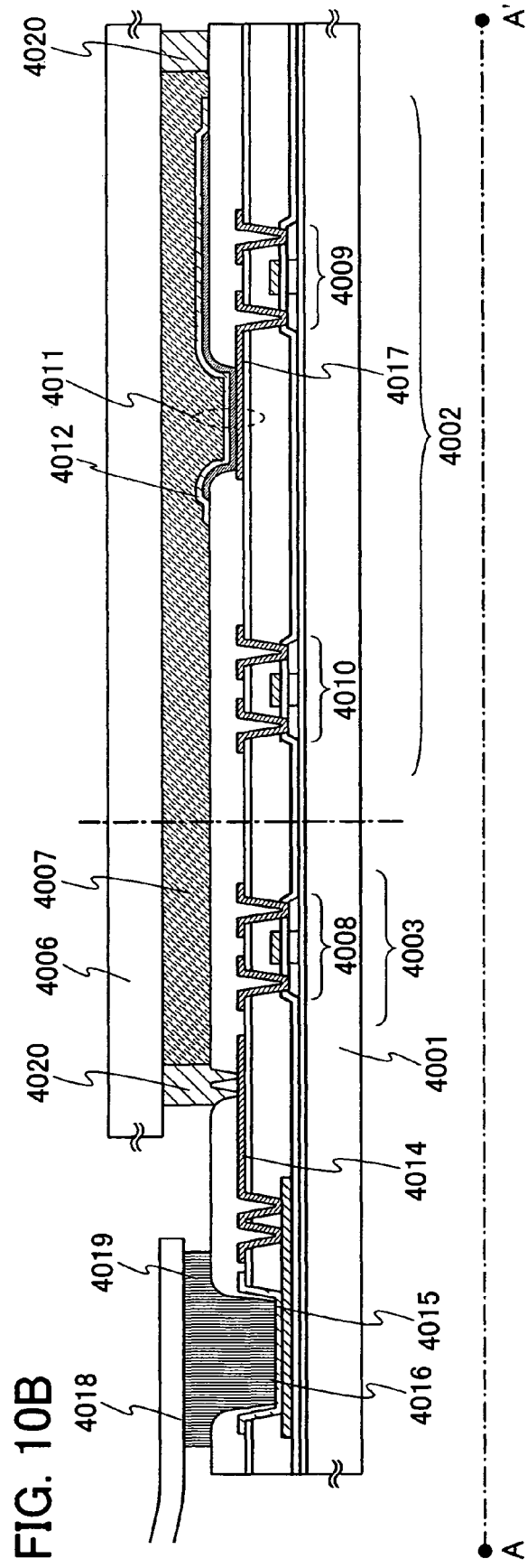

This embodiment will explain the exterior view of a panel corresponding to one mode of the light-emitting device of the present invention with reference to FIGS. 10A and 10B. FIG. 10A shows a top view of a panel obtained by sealing of a first substrate, over which transistors and light-emitting elements are formed, and a second substrate with a sealant. FIG. 10B corresponds to a cross-sectional view of FIG. 10A taken along a line A-A'.

A sealant 4020 is provided so as to surround a pixel portion 4002, a signal line driver circuit 4003, and a scanning line driver circuit 4004 formed over a first substrate 4001. In addition, a second substrate 4006 is provided over the pixel portion 4002, the signal line driver circuit 4003, and the scanning line driver circuit 4004. Accordingly, the pixel portion 4002, the signal line driver circuit 4003, and the scanning line driver circuit 4004 are tightly sealed together with a filler 4007 by the first substrate 4001, the sealant 4020, and the second substrate 4006.

Each of the pixel portion 4002, the signal line driver circuit 4003, and the scanning line driver circuit 4004 formed over the first substrate 4001 has a plurality of transistors. FIG. 10B shows a transistor 4008 included in the signal line driver circuit 4003, and a driving transistor 4009 and a switching transistor 4010 included in the pixel portion 4002.

Reference numeral 4011 denotes a light-emitting element. A wiring 4017 connected to a drain of the driving transistor 4009 partially functions as a first electrode of the light-emitting element 4011. In addition, a transparent conductive film functions as a second electrode 4012 of the light-emitting element 4011. Note that the structure of the light-emitting element 4011 is not limited to the one shown in this embodiment. The structure of the light-emitting element 4011 may be changed appropriately in accordance with the direction of light emitted from the light-emitting element 4011 and the polarity of the driving transistor 4009.

Various signals and voltages supplied to the signal line driver circuit 4003, the scanning line driver circuit 4004, or the pixel portion 4002 are not shown in the cross-sectional view in FIG. 10B; however, they are supplied from a connection terminal 4016 via leading out wirings 4014 and 4015.

In this embodiment, the connection terminal 4016 is formed of the same conductive film as the second electrode 4012 of the light-emitting element 4011. The leading out wiring 4014 is formed of the same conductive film as the wiring 4017. The leading out wiring 4015 is formed of the same conductive film as the respective gates of the driving transistor 4009, the switching transistor 4010, and the transistor 4008.

The connection terminal 4016 is electrically connected to a terminal of an FPC 4018 via an anisotropic conductive film 4019.

Note that each of the first substrate 4001 and the second substrate 4006 may be formed of glass, metals (typically, stainless), ceramics, plastics, or the like. As for the plastics, an FRP (Fiberglass-Reinforced Plastics) substrate, a PVF (Polyvinylfluoride) film, a mylar film, a polyester film, or an acrylic resin film may be employed. In addition, a sheet having a structure where aluminum is sandwiched by a PVF film or a mylar film can be employed.

However, the second substrate 4006, which is disposed on the side from which light emitted from the light-emitting element 4011 is extracted, is required to transmit light. Thus, the second substrate 4006 is formed using a light-transmitting material such as a glass substrate, a plastic substrate, a polyester film, or an acrylic film.

As the filler 4007, in addition to inert gas such as a nitrogen gas and an argon gas, an ultraviolet curable resin or a heat curable resin such as PVC (Polyvinyl Chloride), acrylic, polyimide, an epoxy resin, a silicone resin, PVB (Polyvinyl Butyral), or EVA (Ethylene Vinyl Acetate). In this embodiment, a nitrogen gas is employed as the filler.

Note that, besides the above driver circuit, circuits such as CPU and a controller may be integrally formed on the first substrate 4001. This makes it possible to decrease the number of external circuits (ICs) to be connected and further to reduce the weight and thickness, which is particularly effective for mobile terminals or the like.

In this specification, as shown in FIG. 10A, a panel to which the steps up to attaching the FPC have been performed and which uses an EL element for the light-emitting element is referred to as an EL module.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 6]

Figure 11A:
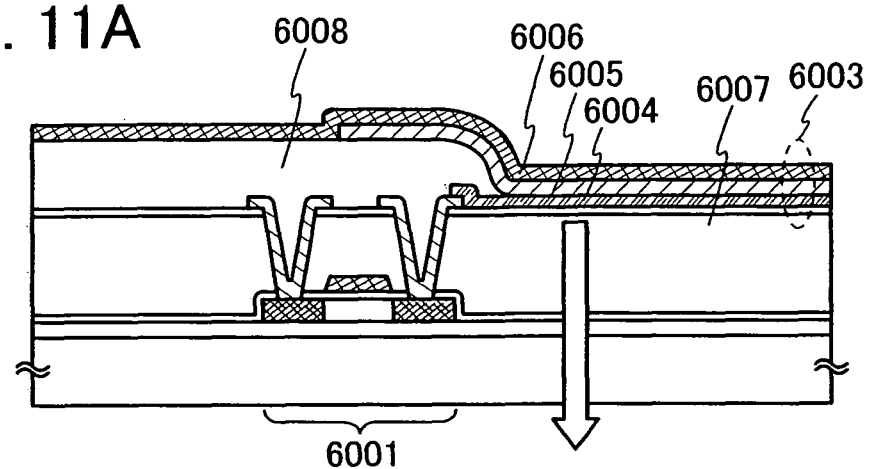
FIGS. 11A to 11C are views each showing Embodiment 6 of the present invention.
Figure 11B:
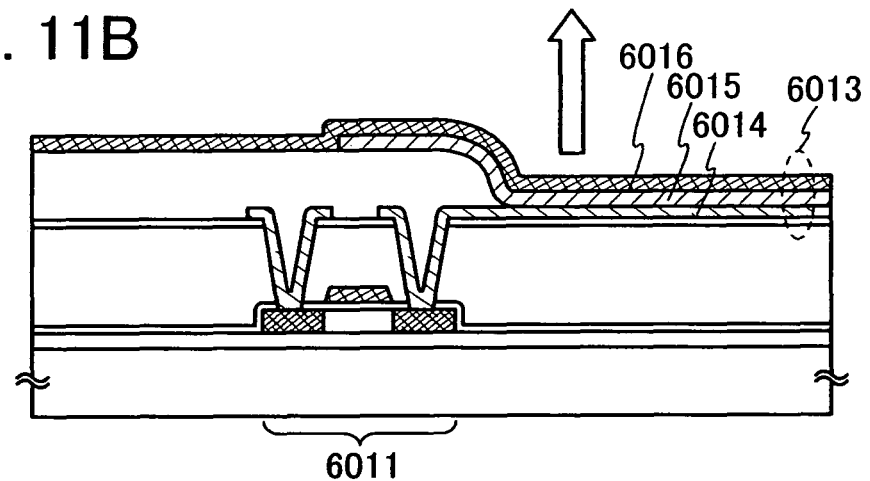
Figure 11C:
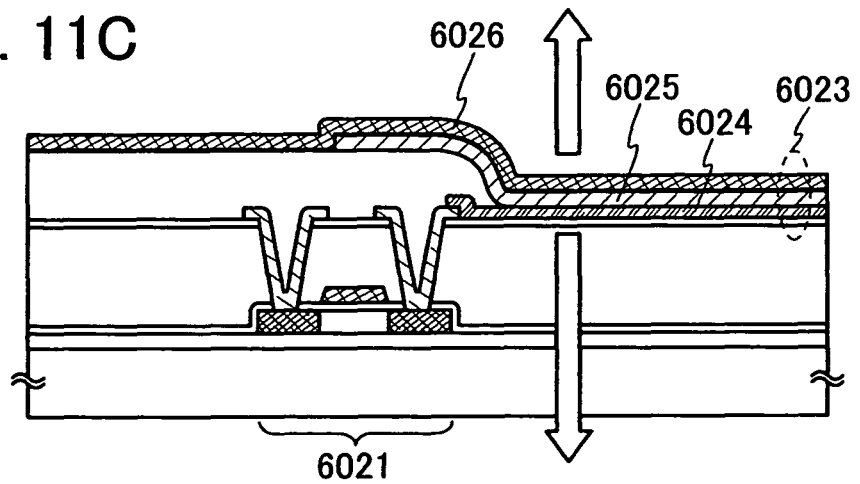

This embodiment will explain the cross-sectional structure of a pixel in a case where a p-channel driving transistor is employed with reference to FIGS. 11A to 11C. Note that FIGS. 11A to 11C each explains a case where a first electrode is an anode while a second electrode is a cathode; however, the first electrode may be a cathode while the second electrode may be an anode.

FIG. 11A is a cross-sectional view of a pixel in the case where a p-channel transistor is used as a driving transistor 6001, and light emitted from a light-emitting element 6003 is extracted from a first electrode 6004.

The driving transistor 6001 is covered with an interlayer insulating film 6007, over which a bank 6008 having an opening is formed. In the opening of the bank 6008, the first electrode 6004 is partially exposed, and an electroluminescent layer 6005 and a second electrode 6006 are sequentially stacked over the first electrode 6004 in the opening.

The interlayer insulating film 6007 can be formed of an organic resin film, an inorganic insulating film, or an insulating film formed of a siloxane-based material as a starting material and having Si—O—Si bond (hereinafter referred to as a siloxane insulating film). A siloxane-based insulating film may include as a substituent at least one of fluorine, alkyl group, and aryl group, as well as hydrogen. The interlayer insulating film 6007 may be formed using a low dielectric constant material (low-k material).

The bank 6008 can be formed using an organic resin film, an inorganic insulating film, or a siloxane-based insulating film. The organic resin film includes, for example, acrylic, polyimide, polyamide, or the like, while the inorganic insulating film includes silicon oxide, silicon nitride oxide, or the like. In particular, by forming the bank 6008 using a photosensitive organic resin film, forming an opening portion over the first electrode 6004, and controlling a sidewall of the opening to have a gradient with a continuously variable curvature, the first electrode 6004 and the second electrode 6006 can be prevented from being connected.

The first electrode 6004 is formed with a material or a thickness to transmit light, which is suitable for being used as an anode. For example, the first electrode 6004 can be formed using indium tin oxide (ITO), zinc oxide (ZnO), indium zinc oxide (IZO), gallium-doped zinc oxide (GZO), or other light-transmitting oxide conductive material. Alternatively, the first electrode 6004 may be formed using indium tin oxide containing silicon oxide (hereinafter referred to as ITSO), or a mixture of indium oxide containing silicon oxide and 2 to 20% of zinc oxide (ZnO). In addition to the above light-transmitting oxide conductive material, the first electrode 6004 may be formed using a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film. However, in the case of using a material other than the light-transmitting oxide conductive material, the first electrode 6004 is formed thin enough to transmit light (preferably, approximately 5 to 30 nm).

The second electrode 6006 is formed with a material or a thickness to reflect or shied light. For example, a metal, an alloy, an electrically conductive compound, and a mixture thereof each having a low work function can be used. Specifically, in addition to an alkaline metal such as Li or Cs, an alkaline earth metal such as Mg, Ca or Sr, an alloy containing such metals (Mg:Ag, Al:Li, Mg:In, or the like), and a compound of such materials (calcium fluoride or calcium nitride), a rare-earth metal such as Yb or Er can be used. In the case of providing an electron-injecting layer for the electroluminescent layer 6005, other conductive layers such as an Al layer may be employed as well.

The electroluminescent layer 6005 is formed in a single layer or a plurality of layers. When the electroluminescence layer 6005 has a plurality of layers, the layers can be classified into a hole-injecting layer, a hole-transporting layer, a light-emitting layer, an electron-transporting layer, an electron-injecting layer, or the like in terms of the carrier transporting properties. When the electroluminescent layer 6005 has any of the hole-injecting layer, the hole-transporting layer, the electron-transporting layer, and the electron-injecting layer in addition to the light-emitting layer, the hole-injecting layer, the hole-transporting layer, the light-emitting layer, the electron-transporting layer, and the electron-injecting layer are sequentially formed over the first electrode 6004. Note that the interface between each layer is not necessarily distinct, and there might be a case where a material forming each layer is partially mixed into the adjacent layer, in which case the interface between each layer is unclear. Each layer may be formed using an organic-based material or an inorganic-based material. As the organic-based material, any of a high molecular weight organic material, a medium molecular weight organic material, and a low molecular weight organic material can be used. Note that the medium molecular weight material corresponds to a low polymer having repeated structural units (the degree of polymerization) of approximately 2 to 20. There is no clear distinction between the hole-injecting layer and the hole-transporting layer. The hole-injecting layer is in contact with the anode, and a layer in contact with the light-emitting layer is distinguished as a hole-transporting layer for convenience. The same can be said for the electron-transporting layer and the electron-injecting layer. A layer in contact with the cathode is referred to as an electron-injecting layer, while a layer in contact with the light-emitting layer is referred to as an electron-transporting layer. In some cases, the light-emitting layer may combine the function of the electron-transporting layer, and it is therefore referred to as a light-emitting electron-transporting layer, too.

In the case of the pixel shown in FIG. 11A, light emitted from the light-emitting element 6003 can be extracted from the first electrode 6004 as shown by a hollow arrow.

FIG. 11B shows a cross-sectional view of a pixel in a case where a p-channel transistor is used as a driving transistor 6011, and light emitted from a light-emitting element 6013 is extracted from a second electrode 6016. Over the first electrode 6014, an electroluminescent layer 6015 and the second electrode 6016 are sequentially stacked.

The first electrode 6014 is formed with a material or a thickness to reflect or shield light, which is suitable for being used as an anode. For example, the first electrode 6014 may be formed of a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film.

The second electrode 6016 is formed with a material or a thickness to reflect or shied light. For example, a metal, an alloy, an electrically conductive compound, and a mixture thereof each having a low work function can be used. Specifically, in addition to an alkaline metal such as Li or Cs, an alkaline earth metal such as Mg, Ca or Sr, an alloy containing such metals (Mg:Ag, Al:Li, Mg:In, or the like), and a compound of such materials (calcium fluoride or calcium nitride), a rare-earth metal such as Yb or Er can be used. In the case of providing an electron-injecting layer for the electroluminescent layer 6015, other conductive layers such as an Al layer may be employed as well. The second electrode 6016 is formed thin enough to transmit light (preferably, approximately 5 to 30 nm). Note that the second electrode 6016 can also be formed using indium tin oxide (ITO), zinc oxide (ZnO), indium zinc oxide (IZO), gallium-doped zinc oxide (GZO), or other light-transmitting oxide conductive material. Alternatively, the second electrode 6016 may be formed using indium tin oxide containing silicon oxide (ITSO), or a mixture of indium oxide containing silicon oxide and 2 to 20% of zinc oxide (ZnO). In the case of using the light-transmitting oxide conductive material, the electroluminescent layer 6015 is desirably provided with an electron-injecting layer.

The electroluminescent layer 6015 can be formed in the same manner as the electroluminescent layer 6005 in FIG. 11A.

In the case of the pixel shown in FIG. 11B, light emitted from the light-emitting element 6013 can be extracted from the second electrode 6016 as shown by a hollow arrow.

FIG. 11C shows a cross-sectional view of a pixel in a case where a p-channel transistor is employed as a driving transistor 6021, and light emitted from a light-emitting element 6023 is extracted from both sides of a first electrode 6024 and a second electrode 6026. Over the first electrode 6024, an electroluminescent layer 6025 and a second electrode 6026 are sequentially stacked.

The first electrode 6024 may be formed in the same manner as the first electrode 6004 shown in FIG. 11A. The second electrode 6026 may be formed in the same manner as the second electrode 6016 shown in FIG. 11B. In addition, the electroluminescent layer 6025 may also be formed in the same manner as the electroluminescent layer 6005 shown in FIG. 11A.

In the case of the pixel shown in FIG. 11C, light emitted from the light-emitting element 6023 can be extracted from both sides of the first electrode 6024 and the second electrode 6024 as shown by hollow arrows.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 7]

Figure 12A:
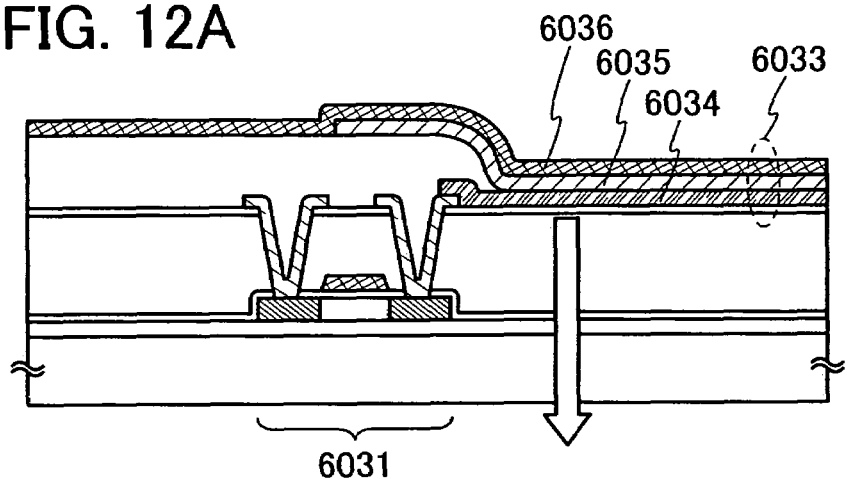
FIGS. 12A to 12C are views each showing Embodiment 7 of the present invention.
Figure 12B:
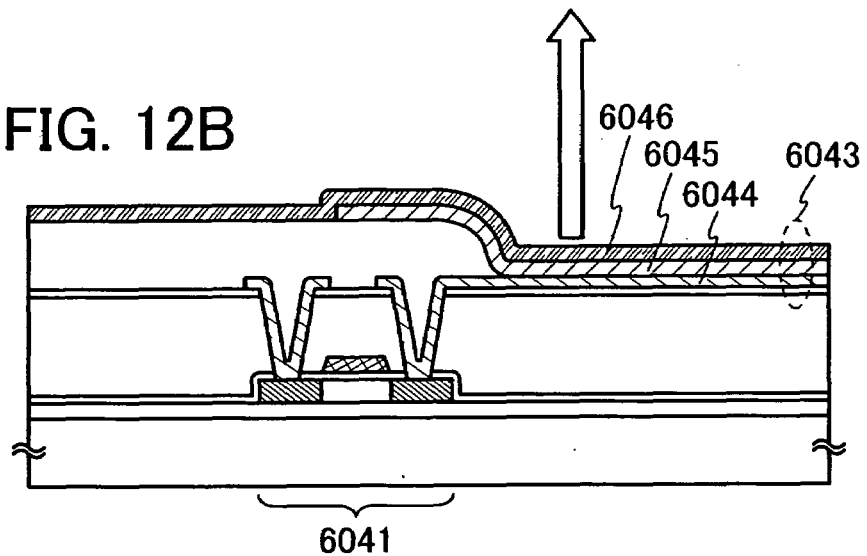
Figure 12C:
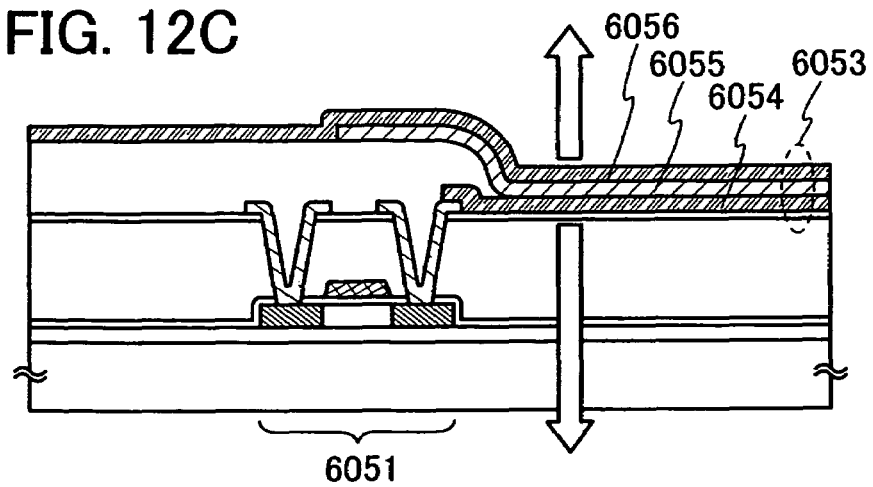

This embodiment will explain the cross-sectional structure of a pixel in the case where an n-channel driving transistor is employed with reference to FIGS. 12A to 12C. Note that FIGS. 12A to 12C each shows the case where a first electrode is a cathode while a second electrode is an anode; however, the first electrode may be an anode while the second electrode may be a cathode.

FIG. 12A shows the cross-sectional view of a pixel in a case where an n-channel transistor is employed as a driving transistor 6031, and light emitted from a light-emitting element 6033 is extracted from a first electrode 6034. Over the first electrode 6034, an electroluminescent layer 6035 and a second electrode 6036 are sequentially stacked.

The first electrode 6034 is formed with a material or a thickness to reflect or shied light. For example, a metal, an alloy, an electrically conductive compound, and a mixture thereof each having a low work function can be used. Specifically, in addition to an alkaline metal such as Li or Cs, an alkaline earth metal such as Mg, Ca or Sr, an alloy containing such metals (Mg:Ag, Al:Li, Mg:In, or the like), and a compound of such materials (calcium fluoride or calcium nitride), a rare-earth metal such as Yb or Er can be used. In the case of providing an electron-injecting layer for the electroluminescent layer 6035, other conductive layers such as an Al layer may be employed as well. The first electrode 6034 is formed thin enough to transmit light (preferably, approximately 5 to 30 nm). Further, a light-transmitting conductive layer may be formed using a light-transmitting oxide conductive material so as to be in contact with the top or bottom surface of the above conductive layer having a thickness to transmit light, thereby suppressing sheet resistance of the first electrode 6034. Note that the first electrode 6034 can also be formed using indium tin oxide (ITO), zinc oxide (ZnO), indium zinc oxide (IZO), gallium-doped zinc oxide (GZO), or other light-transmitting oxide conductive material. Alternatively, the second electrode 6016 may be formed using indium tin oxide containing silicon oxide (ITSO), or a mixture of indium oxide containing silicon oxide and 2 to 20% of zinc oxide (ZnO). In the case of using the light-transmitting oxide conductive material, the electroluminescent layer 6035 is desirably provided with an electron-injecting layer.

The second electrode 6036 is formed with a material or a thickness to reflect or shield light, which is suitable for being used as an anode. For example, the second electrode 6036 may be formed of a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film.

The electroluminescent layer 6035 can be formed in the same manner as the electroluminescent layer 6005 in FIG. 11A. However, in a case where the electroluminescent layer 6035 has any of a hole-injecting layer, a hole-transporting layer, an electron-transporting layer, and an electron-injecting layer in addition to the light-emitting layer, the electron-injecting layer, the electron-transporting layer, the light-emitting layer, the hole-transporting layer, and the hole-injecting layer are sequentially stacked.

In the case of the pixel shown in FIG. 12A, light emitted from the light-emitting element 6033 can be extracted from the first electrode 6034 as shown by a hollow arrow.

FIG. 12B shows the cross-sectional view of a pixel in a case where an n-channel transistor is employed as a driving transistor 6041, and light emitted from a light-emitting element 6043 is extracted from a second electrode 6046. Over the first electrode 6044, an electroluminescent layer 6045 and a second electrode 6046 are sequentially stacked.

The first electrode 6044 is formed with a material or a thickness to reflect or shied light. For example, a metal, an alloy, an electrically conductive compound, and a mixture thereof each having a low work function can be used. Specifically, in addition to an alkaline metal such as Li or Cs, an alkaline earth metal such as Mg, Ca or Sr, an alloy containing such metals (Mg:Ag, Al:Li, Mg:In, or the like), and a compound of such materials (calcium fluoride or calcium nitride), a rare-earth metal such as Yb or Er can be used. In the case of providing an electron-injecting layer for the electroluminescent layer 6045, other conductive layers such as an Al layer may be employed as well.

The second electrode 6046 is formed with a material or a thickness to transmit light, which is suitable for being used as an anode. For example, the second electrode 6046 can be formed using indium tin oxide (ITO), zinc oxide (ZnO), indium zinc oxide (IZO), gallium-doped zinc oxide (GZO), or other light-transmitting oxide conductive material. Alternatively, the second electrode 6046 may be formed using indium tin oxide containing silicon oxide (hereinafter referred to as ITSO), or a mixture of indium oxide containing silicon oxide and 2 to 20% of zinc oxide (ZnO). In addition to the above light-transmitting oxide conductive material, the second electrode 6046 may be formed using a single-layer film containing one or more of TiN, ZrN, Ti, W, Ni, Pt, Cr, Ag, Al, and the like, a stacked-layer structure of a titanium nitride film and a film containing aluminum as its main component, or a three-layer structure of a titanium nitride film, a film containing aluminum as its main component, and a titanium nitride film. However, in the case of using a material other than the light-transmitting oxide conductive material, the second electrode 6046 is formed thin enough to transmit light (preferably, approximately 5 to 30 nm).

The electroluminescent layer 6045 can be formed in the same manner as the electroluminescent layer 6035 in FIG. 12A.

In the case of the pixel shown in FIG. 12B, light emitted from the light-emitting element 6043 can be extracted from the second electrode 6046 as shown by a hollow arrow.

Next, FIG. 12C shows the cross-sectional view of a pixel in a case where an n-channel transistor is employed as a driving transistor 6051, and light emitted from a light-emitting element 6053 is extracted from both sides of a first electrode 6054 and a second electrode 6056. Over the first electrode 6054, an electroluminescent layer 6055 and a second electrode 6056 are sequentially stacked.

The first electrode 6054 can be formed in the same manner as the first electrode 6034 in FIG. 12A. The second electrode 6056 can be formed in the same manner as the second electrode 6046 in FIG. 12B. The electroluminescent layer 6055 can be formed in the same manner as the electroluminescent layer 6035 in FIG. 12A.

In the case of the pixel shown in FIG. 12C, light emitted from the light-emitting element 6053 can be extracted from both sides of the first electrode 6054 and the second electrode 6056 as shown by hollow arrows.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 8]

The light-emitting device of the present invention can be formed with the use of a printing method typified by screen printing and offset printing, or a droplet discharge method. The droplet discharge method is a method for forming a predetermined pattern by discharging of droplets containing a predetermined composition from a pore, which includes an ink-jet method or the like. When using the above printing method or droplet discharge method, various wirings typified by a signal line, a scanning line, and a power supply line; a gate electrode of a TFT; an electrode of a light-emitting element; or the like can be formed. However, the printing method or the droplet discharge method is not necessarily used for the whole steps for forming a pattern. Thus, for example, the printing method or the droplet discharge method may be used to form the light-emitting device relating to this embodiment at least in part of the steps, and a lithography method may be additionally used as follows: wirings and a gate electrode are formed by the printing method or the droplet discharge method while a semiconductor film is patterned by a lithography method Moreover, a mask used for patterning may be formed by a printing method or a droplet discharge method as well.

Figure 13:
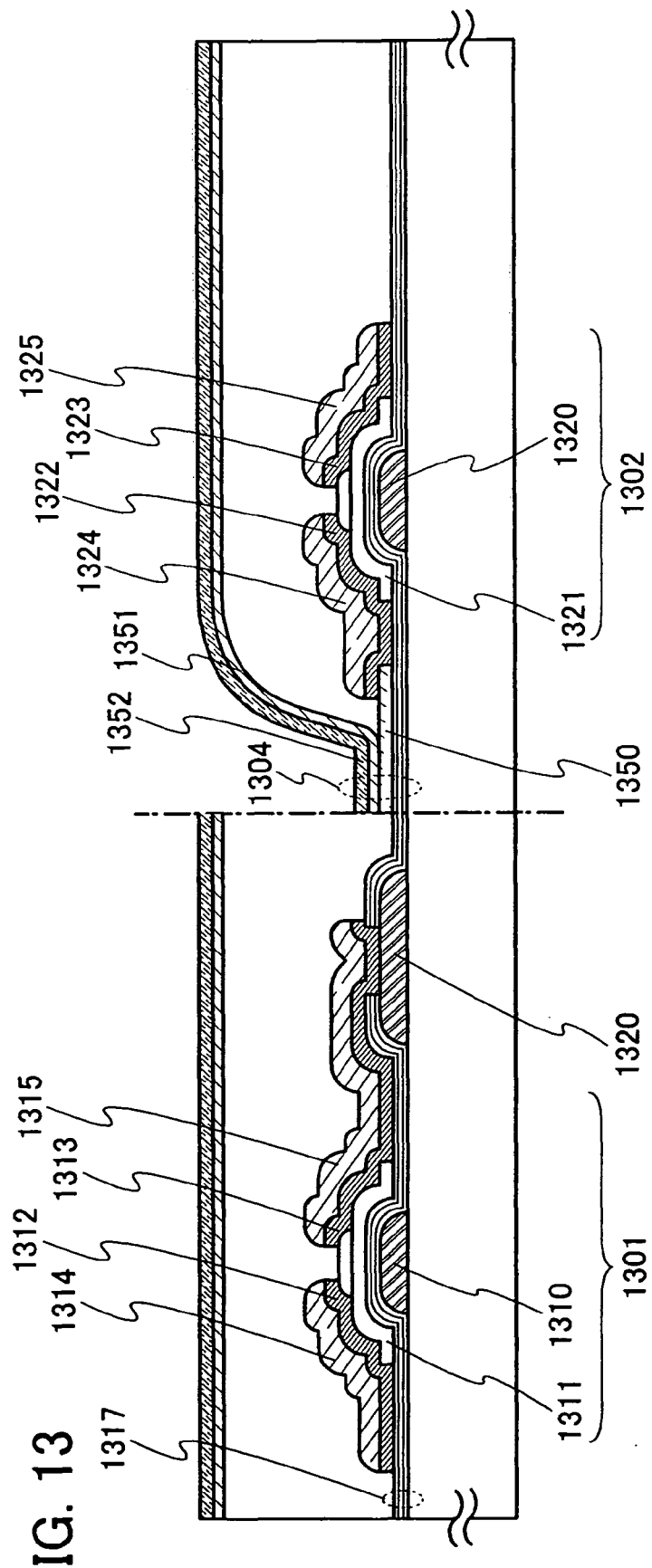
FIG. 13 is a view showing Embodiment 8 of the present invention.

FIG. 13 shows an example of the cross-sectional view of the light-emitting device of the present invention formed with the use of a droplet discharge method. In FIG. 13, reference numeral 1301 denotes a switching transistor; 1302, a driving transistor; and 1304, a light-emitting element. The driving transistor 1302 is desirably an n-channel transistor, in which case it is desirable that a first electrode 1350 be a cathode while a second electrode 1352 be an anode.

The switching transistor 1301 includes a gate 1310, a first semiconductor film 1311 including a channel formation region, a gate insulating film 1317 formed between the gate 1310 and the first semiconductor film 1311, second semiconductor films 1312 and 1313 functioning as a source or a drain, a wiring 1314 connected to the second semiconductor film 1312, and a wiring 1315 connected to the second semiconductor film 1313.

The driving transistor 1302 includes a gate 1320, a first semiconductor film 1321 including a channel formation region, the gate insulating film 1317 formed between the gate 1320 and the first semiconductor film 1321, second semiconductor films 1322 and 1323 functioning as a source or a drain, a wiring 1324 connected to the second semiconductor film 1322, and a wiring 1325 connected to the second semiconductor film 1323.

The wiring 1314 corresponds to a signal line, and the wiring 1315 is electrically connected to the gate 1320 of the transistor 1302. The wiring 1325 corresponds to a power supply line.

The wiring 1324 is connected to the first electrode 1350 of the light-emitting element 1304. Over the first electrode 1350, an electroluminescent layer 1351 and the second electrode 1352 are sequentially stacked. The light-emitting element 1304 is formed in a portion where the first electrode 1350, the electroluminescent layer 1351, and the second electrode 1352 are stacked.

By forming a pattern using the droplet discharge method or the printing method, a series of steps for a lithography method that includes photoresist formation, exposure, development, etching, and peeling can be simplified. In addition, in the case of the droplet discharge method or the printing method, waste of materials that would be removed by etching can be avoided unlike the case of the lithography method. Moreover, since an expensive mask for exposure is not required, manufacturing cost of the light-emitting device can be suppressed.

Furthermore, unlike a lithography method, etching is not required in order to form wirings. Thus, a step of forming wirings can be completed in an extremely shorter time than the case of the lithography method. In particular, when the wiring is formed with a thickness of greater than or equal to 0.5 μm, preferably greater than or equal to 2 μm, the wiring resistance can be suppressed. Accordingly, the increase of the wiring resistance along with the enlargement of the light-emitting device can be suppressed while shortening time required for the step of forming wirings.

The first semiconductor films 1311 and 1321 may be either an amorphous semiconductor or a semi-amorphous semiconductor (SAS).

An amorphous semiconductor can be obtained by decomposing a compound containing silicon, for example. As the typical compound containing silicon, $SiH_4$ or $Si_2H_6$ can be employed. The compound containing silicon may be diluted with hydrogen, or hydrogen and helium.

Similarly, an SAS can be obtained by decomposing a compound containing silicon by glow discharge, for example. As the typical compound containing silicon, $Si_2H_6$, $SiH_2Cl_2$, $SiHCl_3$, $SiCl_4$, $SiF_4$, or the like as well as $SiH_4$ can be used. The SAS can be formed easily by diluting the compound containing silicon with a hydrogen gas or a mixed gas of hydrogen and one or more of rare gas elements of helium, argon, krypton, and neon. The compound containing silicon is preferably diluted at a rate of 1:2 to 1:1000. Further, the compound containing silicon may be mixed with a carbide gas such as $CH_4$ or $C_2H_6$, a germanide gas such as $GeH_4$ or $GeF_4$, $F_2$, or the like such that the energy bandwidth is to be 1.5 to 2.4 eV, or 0.9 to 1.1 eV. A TFT using an SAS as the first semiconductor film can exhibit the mobility of 1 to 10 $cm^2/Vsec$ or more.

The first semiconductor films 1311 and 1321 may also be formed by using a semiconductor obtained by crystallizing of an amorphous semiconductor or a semi-amorphous semiconductor (SAS).

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 9]

This embodiment will explain a case in which potential of a current supply line is compensated to suppress an effect on luminance due to fluctuation of the amount of current of a light-emitting element caused by change in surrounding temperature and change over time.

A light-emitting element has such a property that its resistance (internal resistance) is changed depending on the surrounding temperature. Specifically, when the room temperature is set at a normal temperature and the temperature is higher than normal, the resistance decreases, while when the temperature is lower than normal, the resistance increases. Therefore, when the temperature increases in the case of applying the same voltage, the amount of current increases to cause the luminance to exceed the desired luminance. When the temperature decreases in the case of applying the same voltage, the amount of current decreases to cause the luminance to fall below the desired luminance. The light-emitting element has such a property that the amount of current decreases over time. Specifically, when a light-emitting period and a non-light-emitting period are accumulated, the resistance increases with the deterioration of the light-emitting element. Thus, when the light-emitting period and the non-light-emitting period are accumulated even in the case of applying the same voltage, the amount of current decreases to cause the luminance to fall below the desired luminance.

Because of the above property of the light-emitting element, the luminance varies because of the change in the surrounding temperature or the change over time. In this embodiment, with the use of the potential of the current supply line of the present invention for compensation, it is possible to suppress an effect on the luminance due to fluctuation in the amount of current of the light-emitting element caused by the change in the ambient temperature and the change over time.

Figure 14:
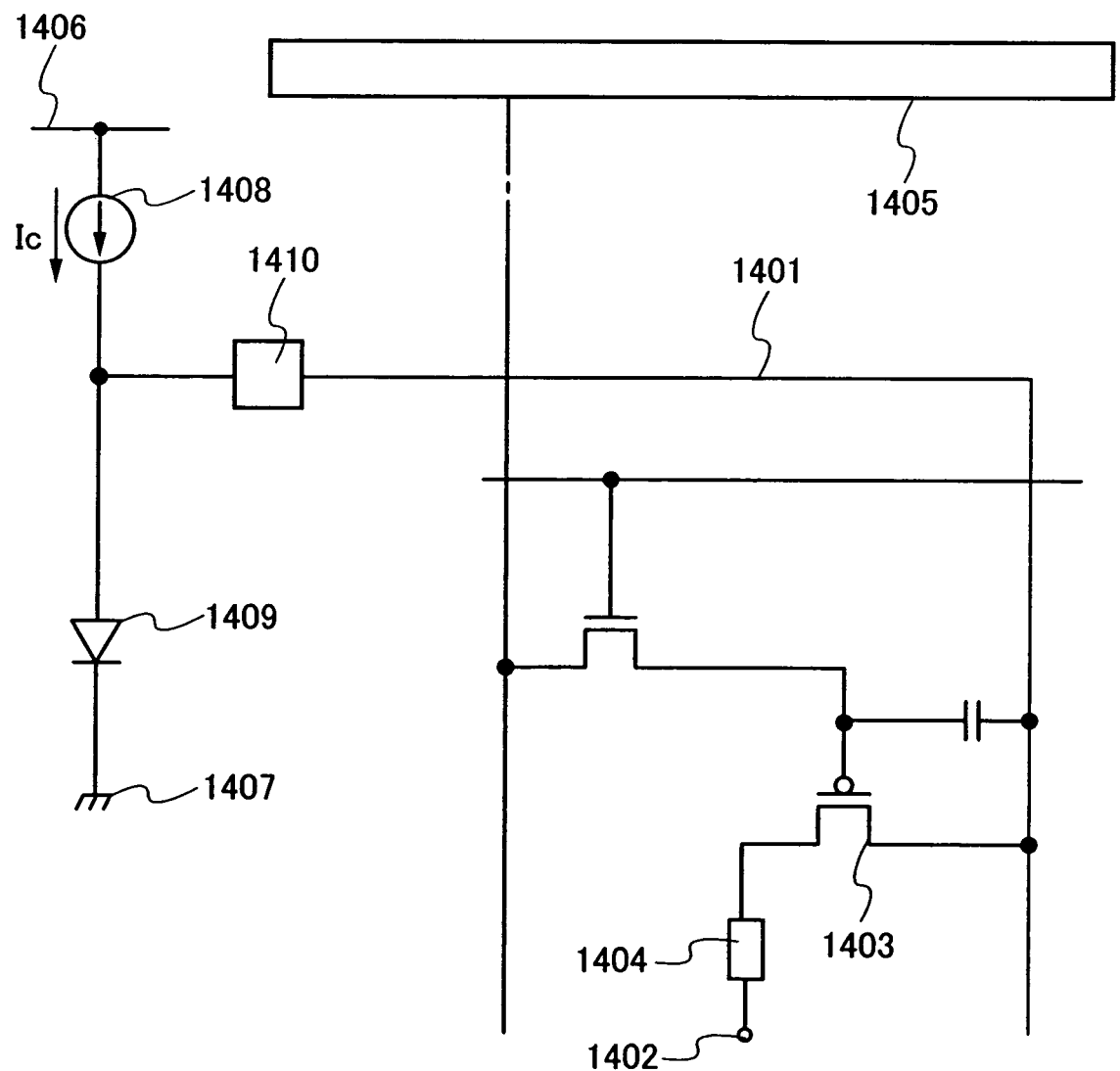
FIG. 14 is a diagram showing Embodiment 9 of the present invention.

FIG. 14 shows a circuit configuration. In FIG. 14, a current supply line 1401 and a counter electrode 1402 are connected to each other through a driver transistor 1403 and a light-emitting element 1404. Then, current flows from the current supply line 1401 to the counter electrode 1402. The light-emitting element 1404 emits light in accordance with the amount of current flowing from the current supply line 1401 to the counter electrode 1402.

In the case of such a pixel configuration, when current keeps flowing to the light-emitting element 1404, the characteristic of the light-emitting element 1404 deteriorates over time. Moreover, the characteristic of the light-emitting element 1404 changes depending on the surrounding temperature.

Specifically, when current keeps flowing to the light-emitting element 1404, the voltage-current characteristic begins to shift. In other words, the resistance of the light-emitting element 1404 increases, so that the amount of flowing current gets smaller even though the same amount of voltage is applied. Moreover, although the same amount of current is fed, the luminous efficiency decreases to lower the luminance. As for the temperature characteristic, when the temperature decreases, the voltage-current characteristic shifts, which raises the resistance of the light-emitting element 1404.

Thus, the above deterioration and effect by the fluctuation are compensated with the use of a monitor circuit. In this embodiment, by adjusting the potential of the current supply line 1401, the deterioration and the fluctuation by the temperature of the light-emitting element 1404 are compensated.

Here, the structure of a monitor circuit will be described. A first monitor power source line 1406 and a second monitor power source line 1407 are connected to each other through a monitor current source 1408 and a monitor light-emitting element 1409. To a connection point of the monitor light-emitting element 1409 and the monitor current source 1408, an input terminal of a sampling circuit 1410 for outputting the potential of the monitor light-emitting element is connected. To an output terminal of the sampling circuit 1410, the current supply line 1401 is connected. Therefore, the potential of the current supply line 1401 is controlled by the output of the sampling circuit 1410.

Next, the operation of the monitor circuit will be described. First, the monitor current source 1408 feeds current with the amount required to make the light-emitting element 1404 emit light with the largest number of gray scales. The amount of current at this time is regarded as Imax.

Then, at opposite ends of the monitor light-emitting element 1409, the voltage with the level necessary to feed current with the amount of Imax is applied. Even when the current-voltage characteristic of the monitor light-emitting element 1409 changes in accordance with the deterioration, temperature, or the like, the voltage to be applied at the opposite ends of the monitor light-emitting element 1409 also changes to be optimum. Therefore, the effect of the fluctuation in the monitor light-emitting element 1409 (such as deterioration or the temperature change) can be compensated.

To an input terminal of the sampling circuit 1410, the voltage to be applied to the monitor light-emitting element 1409 is input. Therefore, the potential of the output terminal of the sampling circuit 1410, that is, the potential of the current supply line 1410 is to be compensated by the monitor circuit, whereby the fluctuation of the light-emitting element 1404 by the deterioration or temperature can be compensated.

Note that the sampling circuit may be any kind of circuit as long as the voltage in accordance with the input voltage can be output. For example, a current amplifier circuit such as a voltage follower circuit can be used; however, the circuit is not limited thereto. The circuit may be formed using any one of an operational amplifier, a bipolar transistor, and a MOS transistor, or a combination thereof.

The monitor light-emitting element 1409 is desirably formed over the same substrate, at the same time, and by the same manufacturing method as the light-emitting element 1404 of the pixel, because the compensation would be misaligned if the characteristic is different in the light-emitting element for the monitor and the light-emitting element to be arranged in the pixel.

Note that, since the light-emitting element 1404 arranged in the pixel often has a period in which current does not flow, if current keeps flowing to the monitor light-emitting element 1409, the deterioration progresses in the monitor light-emitting element 1409 rather than in the light-emitting element 1404. Therefore, the potential output from the sampling circuit 1410 becomes an excessively compensated potential. Thus, the potential output from the sampling circuit 1410 may follow the actual degree of deterioration of the pixel. For example, if the lighting ratio of the whole screen is 30% on average, current may be fed to the monitor light-emitting element 1409 for the period corresponding to a luminance of 30%. At that time, the monitor light-emitting element 1409 has a period in which current does not flow; however, voltage may be made to supply voltage constantly from the output terminal of the sampling circuit 1410. In order to realize this, the input terminal of the sampling circuit 1410 may be provided with a capacitor element, so that the potential generated when current is fed to the monitor light-emitting element 1409 may be held there.

Note that, when the monitor circuit is operated in accordance with the light-emitting element having the highest gray scale, the excessively compensated potential is output. However, since burning-in at the pixel (variation in luminance due to the fluctuation in the degree of deterioration in each pixel) becomes unnoticeable, it is desirable that the monitor circuit be operated in accordance with the light-emitting element having the highest gray scale.

In this embodiment, it is much preferable that the driver transistor 1403 be operated in the linear region. The driver transistor 1403 is operated approximately as a switch by operation in the linear region. Therefore, it is possible to suppress the effect of the fluctuation in the characteristic of the driver transistor 1403, which is caused by the deterioration, temperature, or the like. In the case of operating the driver transistor 1403 only in the linear region, whether current is fed to the light-emitting element 1404 or not is often controlled in a digital manner. In this case, in order to increase the number of gray scales, it is preferable to combine a time gray-scale method, an area gray-scale method, and the like.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment mode, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

[Embodiment 10]

The display device of the present invention can enhance reduction in size of its frame while suppressing power consumption; therefore, it is optimum to use the display device for a display portion of an electronic device such as a cellular phone, a portable game machine, an electronic book, a camera such as a video camera or a digital still camera, or a handheld portable device.

As other electronic devices that can use the display device of the present invention, there are a video such as a video camera or a digital camera, a goggle display (a head mounted display), a navigation system, an audio reproducing device (a car audio, an audio component, or the like), a computer, a game machine, an image reproducing device provided with a recording medium (typically, a device reproducing a recording medium such as a DVD (Digital Versatile Disc), and having a display portion for displaying the reproduced image), and the like. Specific examples of such electronic devices are shown in FIGS. 15A to 15C.

Figure 15A:
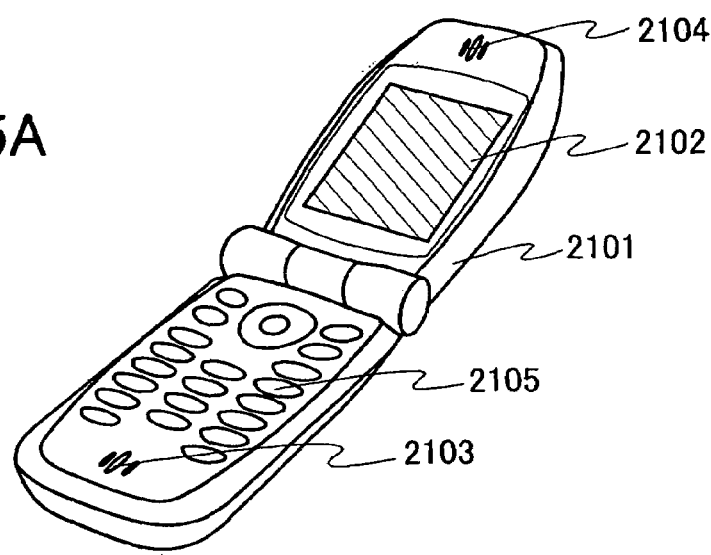
FIGS. 15A to 15C are views each showing Embodiment 10 of the present invention.

FIG. 15A is a cellular phone, which includes a main body 2101, a display portion 2102, an audio input portion 2103, an audio output portion 2104, operating keys 2105, and the like. By forming the display portion 2102 with the use of the semiconductor display device of the present invention, a cellular phone which is one of the electronic devices of the present invention can be completed.

Figure 15B:
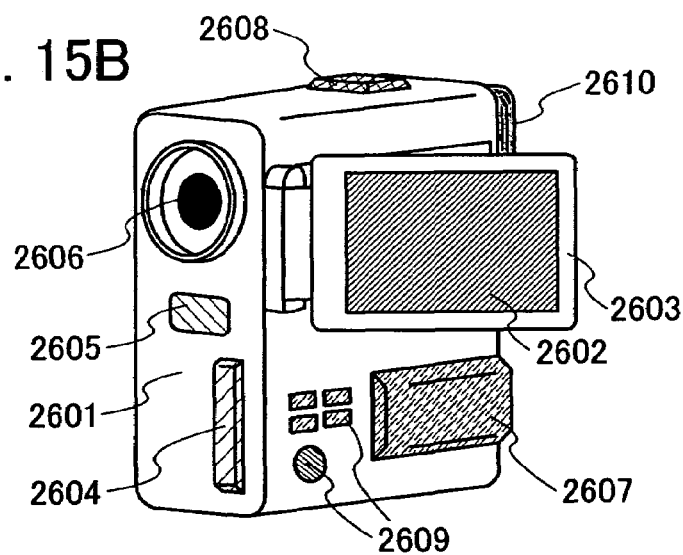

FIG. 15B is a video camera, which includes a main body 2601, a display portion 2602, a housing 2603, an external connection port 2604, a remote control receiving portion 2605, an image receiving portion 2606, a battery 2607, an audio input portion 2608, operating keys 2609, an eyepiece portion 2610, and the like. By forming the display portion 2602 with the use of the semiconductor display device of the present invention, a video camera which is one of the electronic devices of the present invention can be completed.

Figure 15C:
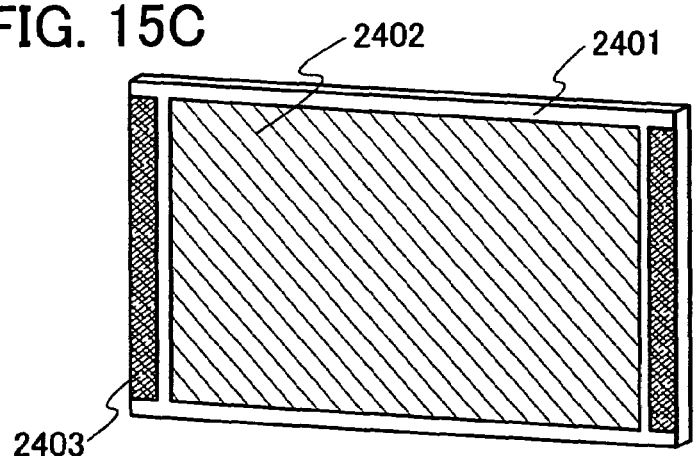
Figure 16A:
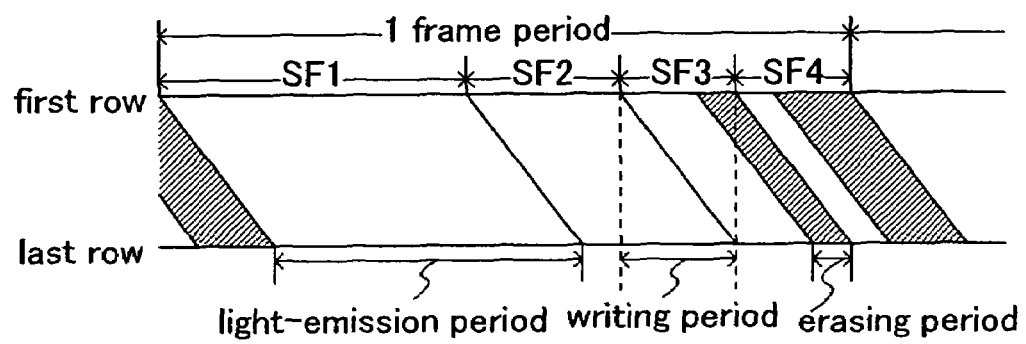
FIGS. 16A and 16B are diagrams each showing a conventional pixel structure.
Figure 16B:
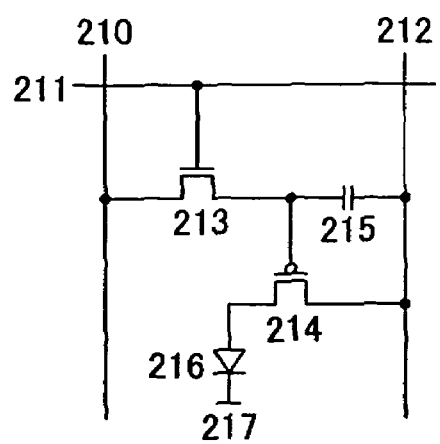
Figure 17:
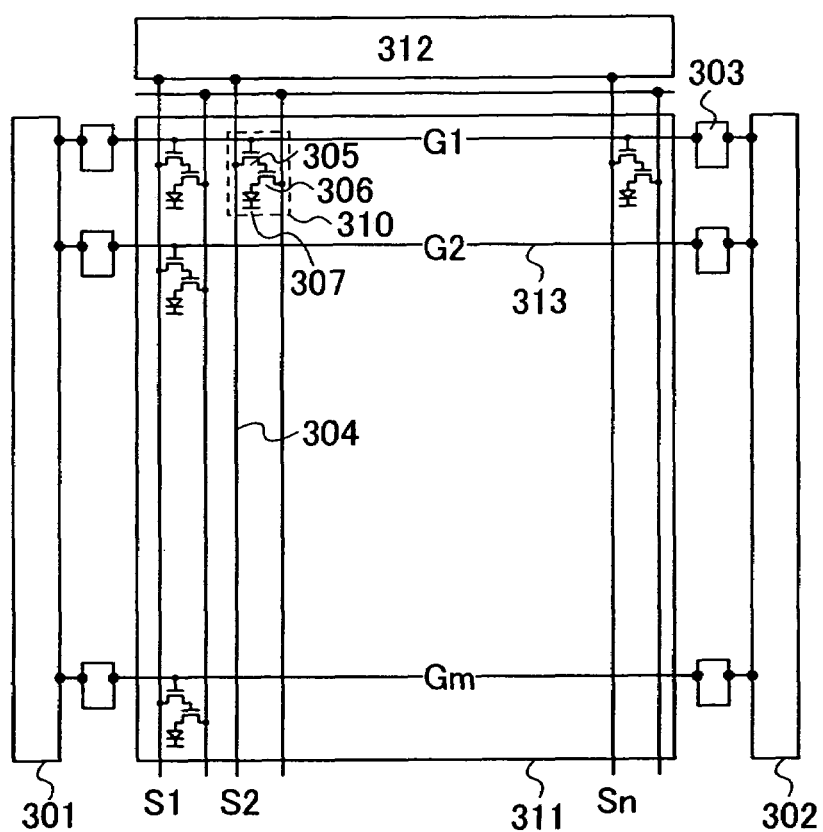
FIG. 17 is a diagram showing a conventional display device including a scanning line driver circuit.

FIG. 15C shows a display device, which includes a housing 2401, a display portion 2402, a speaker portion 2403, and the like. By forming the display portion 2402 with the use of the semiconductor display device of the present invention, a display device which is one of the electronic devices of the present invention can be completed. Note that the display device includes all information display devices for computer, TV broadcast reception, advertisement, and the like.

As set forth above, the applicable range of the present invention is so wide that the present invention can be used for electronic devices of various fields.

Note that this embodiment can be appropriately combined with the embodiment mode and other embodiments of this specification. In a time division gradation method (also referred to as a time gray-scale method) which is one of the driving methods of a display device, a row writing period is divided into half, the first half of the row writing period (a first row writing period) is used for writing video signals into pixels, and the second half of the row writing period (a second row writing period) is used for writing signals into each pixel for forcibly stopping current supply to a light-emitting element. By writing such signals for forcibly stopping current supply to a light-emitting element into each pixel, a non-display period is provided; thus, the sub-frame period can be made shorter than the writing period. With the use of the scanning line driver circuit having the structure of the above embodiment mode, there is no need to repeat charge and discharge of all scanning lines in an erasing period which is a period where signals for forcibly stopping current supply to light-emitting elements are input; therefore, the power consumption can be reduced considerably. Moreover, with the use of the scanning line driver circuit having the structure of the above embodiment, there is no need to provide a switching circuit or the like. Further, with the use of the scanning line driver circuit having the structure of the above embodiment mode, the scanning line driver circuit can be operated by being arranged only on one side; therefore, the total circuit area can be reduced considerably.

Additionally, the length of the writing period can be secured even when the number of sub-frame appearing in one frame period is increased; therefore, the number of gray scales can be increased while suppressing the drive frequency of a driver circuit. In addition, even when the sub-frame is further divided into a plurality of sub-frame, the length of the writing period can be secured; therefore, the generation of pseudo contours can be suppressed while suppressing the drive frequency of a driver circuit.

The present application is based on Japanese Patent Application serial No. 2006-006766 filed on Jan. 13, 2006 in Japanese Patent Office, the entire contents of which are hereby incorporated by reference.

What is claimed is:

1. A display device comprising:
   a scanning line driver circuit; and
   m scanning lines (m is a natural number of greater than or equal to 2) electrically connected to the scanning line driver circuit,
   wherein 4k-stage (k is a natural number) flip-flop circuits corresponding to each of the m scanning lines are provided in a shift register included in the scanning line driver circuit,
   wherein an output of a fourth stage flip-flop circuit of 4k-stage flip-flop circuits corresponding to an i-th scanning line ($1 \leq i \leq m-1$) is electrically connected to an input of a first stage flip-flop circuit of 4k-stage flip-flop circuits corresponding to an (i+1)-th scanning line, and
   wherein a level shifter is configured to amplify directly an output of the first stage flip-flop circuit of the 4k-stage flip-flop circuits.

2. A display device according to claim 1, wherein selection signals is output from any one of the 4k-stage flip-flop circuits.

3. A display device according to claim 1, wherein a start pulse is input from a side of a flip-flop circuit corresponding to first scanning line.

4. A display device according to claim 1, wherein, in a preceding stage of a flip-flop circuit corresponding to first scanning line to which a start pulse is input, in the scanning line driver circuit, at least one flip-flop circuit is further provided.

5. An electronic device having the display device according to claim 1.

6. A display device comprising:
a scanning line driver circuit; and
m (m is a natural number of greater than or equal to 2) scanning lines electrically connected to the scanning line driver circuit,
wherein 4k-stage (k is a natural number) flip-flop circuits corresponding to each of first to (m−1)-th scanning lines are provided, and at least one-stage flip-flop circuit corresponding to m-th scanning line is provided, in a shift register included in the scanning line driver circuit,
wherein an output of a fourth stage flip-flop circuit of 4k-stage flip-flop circuits corresponding to an i-th scanning line (1≤i≤m−2) is electrically connected to an input of a first stage flip-flop circuit of 4k-stage flip-flop circuits corresponding to an (i+1)-th scanning line,
wherein an output of a fourth stage flip-flop circuit of 4k-stage flip-flop circuits corresponding to the (m−1)-th scanning line is electrically connected to an input of the one-stage flip-flop circuit corresponding to the m-th scanning line, and
wherein a level shifter is configured to amplify directly an output of the first stage flip-flop circuit of the 4k-stage flip-flop circuits.

7. A display device according to claim 6, wherein selection signals is output from any one of the 4k-stage flip-flop circuits.

8. A display device according to claim 6, wherein a start pulse is input from a side of a flip-flop circuit corresponding to first scanning line.

9. A display device according to claim 6, wherein, in a preceding stage of a flip-flop circuit corresponding to first scanning line to which a start pulse is input, in the scanning line driver circuit, at least one flip-flop circuit is further provided.

10. An electronic device having the display device according to claim 6.

11. A display device comprising:
a plurality of pixels:
a signal line driver circuit electrically connected to the plurality of pixels;
a scanning line driver circuit electrically connected to the plurality of pixels; and
m scanning lines (m is a natural number of greater than or equal to 2) electrically connected to the scanning line driver circuit,
wherein 4k-stage (k is a natural number) flip-flop circuits corresponding to each of the m scanning lines are provided in a shift register included in the scanning line driver circuit,
wherein an output of a fourth stage flip-flop circuit of 4k-stage flip-flop circuits corresponding to an i-th scanning line (1≤i≤m−1) is electrically connected to an input of a first stage flip-flop circuit of 4k-stage flip-flop circuits corresponding to an (i+1)-th scanning line, and
wherein a level shifter is configured to amplify directly an output of the first stage flip-flop circuit of the 4k-stage flip-flop circuits.

12. A display device according to claim 11, wherein selection signals is output from any one of the 4k-stage flip-flop circuits.

13. A display device according to claim 11, wherein a start pulse is input from a side of a flip-flop circuit corresponding to first scanning line.

14. A display device according to claim 11, wherein, in a preceding stage of a flip-flop circuit corresponding to first scanning line to which a start pulse is input, in the scanning line driver circuit, at least one flip-flop circuit is further provided.

15. A display device according to claim 11, wherein the plurality of pixels, the signal line driver circuit, and the scanning line driver circuit are provided on a same substrate.

16. A display device according to claim 11, wherein the plurality of pixels are each provided with a light-emitting element, a transistor for driving the light-emitting element, and a transistor for selecting a pixel.

17. An electronic device having the display device according to claim 11.

18. A display device comprising:
a plurality of pixels:
a signal line driver circuit electrically connected to the plurality of pixels;
a scanning line driver circuit electrically connected to the plurality of pixels; and
m (m is a natural number of greater than or equal to 2) scanning lines electrically connected to the scanning line driver circuit,
wherein 4k-stage (k is a natural number) flip-flop circuits corresponding to each of first to (m−1)-th scanning lines are provided, and at least one-stage flip-flop circuit corresponding to m-th scanning line is provided, in a shift register included in the scanning line driver circuit,
wherein an output of a fourth stage flip-flop circuit of 4k-stage flip-flop circuits corresponding to an i-th scanning line (1≤i≤m−2) is electrically connected to an input of a first stage flip-flop circuit of 4k-stage flip-flop circuits corresponding to an (i+1)-th scanning line.,
wherein an output of a fourth stage flip-flop circuit of 4k-stage flip-flop circuits corresponding to the (m−1)-th scanning line is electrically connected to an input of the one-stage flip-flop circuit corresponding to the m-th scanning line, and
wherein a level shifter is configured to amplify directly an output of the first stage flip-flop circuit of the 4k-stage flip-flop circuits.

19. A display device according to claim 18, wherein selection signals is output from any one of the 4k-stage flip-flop circuits.

20. A display device according to claim 18, wherein a start pulse is input from a side of a flip-flop circuit corresponding to first scanning line.

21. A display device according to claim 18, wherein, in a preceding stage of a flip-flop circuit corresponding to first scanning line to which a start pulse is input, in the scanning line driver circuit, at least one flip-flop circuit is further provided.

22. A display device according to claim 18, wherein the plurality of pixels, the signal line driver circuit, and the scanning line driver circuit are provided over a same substrate.

23. A display device according to claim 18, wherein the plurality of pixels are each provided with a light-emitting element, a transistor for driving the light-emitting element, and a transistor for selecting a pixel.

24. An electronic device having the display device according to claim 18.

* * * * *